US006288386B1

(12) United States Patent
Bowen et al.

(10) Patent No.: US 6,288,386 B1
(45) Date of Patent: *Sep. 11, 2001

(54) CIRCUIT HAVING A FLEXIBLE PRINTED CIRCUIT BOARD FOR ELECTRONICALLY CONTROLLING A NIGHT VISION DEVICE AND NIGHT VISION DEVICE INCLUDING THE SAME

(75) Inventors: James H. Bowen, Salem; Mark A. Bryant; Nathan R. Schlotthober, both of Roanoke, all of VA (US); Michael S. Clamme, Athens, WV (US)

(73) Assignee: ITT Manufacturing Enterprises Inc., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/181,425

(22) Filed: Oct. 28, 1998

(51) Int. Cl.$^7$ ....................................... H01J 40/14
(52) U.S. Cl. ..................... 250/214 VT; 313/532
(58) Field of Search ............ 250/214 VT, 214 R; 313/532, 103 R, 103 CM, 105 CM; 345/7, 8

(56) References Cited

U.S. PATENT DOCUMENTS 5,943,174 * 8/1999 Bryant et al. ................. 359/809
5,959,705 * 9/1999 Fergason ..................... 349/14

* cited by examiner

Primary Examiner—Que T. Le

(74) Attorney, Agent, or Firm—Duane, Morris & Heckscher

(57) ABSTRACT

An electronic circuit for use in a monocular night vision device for electronically controlling a plurality of components within the device, the device having an objective lens assembly for receiving low intensity light, a variable gain image intensifier tube having a user adjustable variable gain controller external to the tube for adjusting the light intensity level of a visible output image, a single eyepiece lens assembly for viewing the output image from the image intensifier assembly; and a non-metallic housing comprising an upper housing for receiving the objective lens assembly, image intensifier assembly, and eyepiece lens assembly, and a lower housing containing a battery cavity for receiving batteries to power the device. The housing aligns the objective lens assembly with the image intensifier assembly and the eyepiece lens assembly along an optical axis wherein the upper and lower housing are coupled to one another along the optical axis. The electronic circuit comprises a rigid printed circuit board (pcb) located within the lower housing having a plurality of contacts for enabling electronic communication with components mounted thereon and with the variable gain image intensifier tube, the rigid pcb including a pair of contacts in electrical communication with the image intensifier tube for energizing the intensifier tube, and a flexible printed circuit board coupled to the rigid pcb and adaptable to the geometry of the upper and lower housings for electronically interconnecting components located within the upper and lower housings with the rigid pcb, the flexible pcb having a first circuit connection to the image intensifier tube and a second circuit connection to an adjustable potentiometer mounted external to the image intensifier tube on the rigid pcb.

27 Claims, 18 Drawing Sheets

CIRCUIT HAVING A FLEXIBLE PRINTED CIRCUIT BOARD FOR ELECTRONICALLY CONTROLLING A NIGHT VISION DEVICE AND NIGHT VISION DEVICE INCLUDING THE SAME

RELATED APPLICATIONS

This application is related to co-pending commonly assigned application Ser. No. 09/123,371 entitled VARIABLE GAIN IMAGE INTENSIFIER, filed on Jul. 27, 1998, and application Ser. No. 09/074,238 entitled IMPROVED MONOCULAR NIGHT VISION DEVICE, filed on May 7, 1998 now U.S. Pat. No. 6,071,639 and assigned to IT Manufacturing Enterprises, the assignee herein.

FIELD OF THE INVENTION

This invention relates generally to electronic circuits and in particular to an electronic circuit including a flexible printed circuit board and a rigid printed circuit board incorporated into a monocular night vision device for electronically connecting components within the lower and upper housing improved night vision operation.

BACKGROUND OF THE INVENTION

A monocular night vision system basically incorporates a single eyepiece lens assembly, image intensifier assembly, and objective lens assembly. Most monocular night vision devices (MNVDs) are compact and lightweight to optimize hand-held use. MNVDS are often referred to as pocket scopes since they could optimally be small enough to be stored in a user's pockets.

Numerous MNVDs exist in the prior art. Examples of some of these night vision devices, including hand-held night vision devices, include U.S. patent application Ser. No. 08/108,989 entitled NIGHT VISION MONOCULARS, filed Aug. 18, 1993; U.S. patent application Ser. No. 08/405, 172 entitled COMPACT NIGHT VISION DEVICE, filed Mar. 16, 1995; U.S. Pat. No. 5,644,425, issued Jul. 1, 1997, entitled NIGHT VISION MONOCULAR WITH UNISTRUCTURAL OPTICAL BED also teaches a hand-held night vision device for use in both military and non-military applications, however these devices generally suffer from a combination of poor performance characteristics and design shortcomings which lead to inefficient device operation or limited flexibility, and poor performance. For example, a number of the monocular night vision devices have main housings which are made of metallic material which make them rugged, but heavy. Moreover, prior art MNVDs are often bulky and uncomfortable to hold in one's hand and are difficult to operate when deployed in completely dark areas. Furthermore, prior art MNVDs are often energy efficient, expending battery power even when not in use, such as during daylight. In the event of a headmounted device, prior art MNVDs did not automatically turn off when removed from the helmet mount or when flipped up in the helmet mount. Still further, prior art devices could not be mounted to an M16/M4 receiver rail configured for the Modular Weapon System Kit (which fits the mounting rail defined in MIL-STD-93), and standard AN/PVS-7 accessories such as the lens cap, sacrificial filter, compass, 3X magnifier, and light interference filter could not be attached to the objective lens assembly of these devices.

As one can ascertain, night vision systems frequently need to include some control functions beyond just "on" and "off". Users commonly want additional features such as: a low-battery indicator, an infrared illuminator for use in very dark areas, an indicator that the infrared illuminator is activated, an automatic cut-off in high-light conditions, an automatic cut-off when the viewing device is flipped up to a stowed position or removed from its mount, and a variable gain control. These features can be implemented piecemeal, or as parts of an integrated control system.

The prior art AN/PVS-7 night vision device, manufactured by IT Corporation, the assignee herein, represents an integrated control system device. The AN/PVS-7 is a binocular viewer having one objective lens, one image intensifier tube, and two eyepieces which view the same output image from the tube via an arrangement of a beam splitter and turning mirrors. The AN/PVS-7 is intended predominantly for use by military ground forces, and can be hand-held or attached to a head mount or helmet mount.

The AN/PVS-7 includes a control circuit which is an application-specific integrated circuit (ASIC), implemented in a complementary metal-oxide semiconductor (CMOS) process, and including both digital and analog subcircuits. This ASIC includes a high-light cutoff circuit described in commonly assigned U.S. Pat. No. 4,843,29, entitled HIGH LIGHT LEVEL CUTOFF APPARATUS FOR USE WITH NIGHT VISION DEVICE, issued to J. Reed and J. Caserta, and incorporated herein by reference. FIG. 6 shows the prior art circuit illustrated in the above patent (FIG. 2 of U.S. Pat. No. 4,843,229) where most of the functional blocks shown are contained in the ASIC. Only the light sensor 8, the crystal 22, the voltage multiplier 4, the power field-effect transistor (FET) 3, the battery 1, the goggles (intensifier tube) 2, and the on/off switch are not located inside the ASIC, due to their unsuitability for implementation in the CMOS process. The crystal 22 may be replaced by a resistor-capacitor (RC) timing network, in order to reduce cost while still providing sufficient timing accuracy. This ASIC also includes circuitry to implement a flashing low-battery indicator and flip-up cutoff. In the AN/PVS-7, the ASIC and its associated electronic parts, including the voltage multiplier 4, the power FET 3, RC timing network, and some associated power filtering components are assembled on one small surface-mount rigid printed circuit board or ceramic substrate. Other parts, including the on/off/ir switch, the connections for the intensifier tube, the light sensor (photo resistor or photo transistor), the infrared illuminator, the low battery indicator light-emitting diode (LED), the infrared indicator LED, and the magnetic reed switch (which is the sensor for the flip-up cutoff function) are required to be located elsewhere in the overall housing, due to physical access or optical exposure requirements. These parts are interconnected to the main circuit via a flexible polyamide circuit with etched copper conductors. The battery contacts are connected by wires to the rest of the circuit.

The flip-up cutoff feature assures that the user does not inadvertently leave the viewing device on or give away his position by exposing the glow from the intensifier, when the viewing device is removed from its mount or is flipped up to the stowed position. The flip-up cutoff feature functions as follows. The magnetic reed switch is placed in the AN/PVS-7 viewing device housing, inside the housing wall which is in proximity to the mounting point. The magnetic reed switch is a single-pole, double-throw device. In the de-energized (no magnetic field applied) state, the magnetic reed switch connects an input of the ASIC to the positive supply voltage considered logic "high". In the energized (magnetic field applied) state, the magnetic reed switch connects the input of the ASIC to the negative supply voltage. This is considered logic "low". A small magnet is placed in the head mount and helmet mount, in a location proximal to the mounting point for the viewing device. When the viewing device is installed in the mount, the magnetic reed switch comes in proximity to the magnet, the reed switch is energized, and the ASIC input transits from a logic high state to a logic low state, provided the viewing device has been turned on. The ASIC contains logic which ignores the reed switch state at the moment when the viewing device is turned on, and also ignores high-to-low transitions of the input from the reed switch. Thus, the viewing device can be switched on whether or not it is in the mount, and the viewing device will not turn off when it is installed in the mount. When the viewing device is removed from the mount or flipped up to the stowed position in the mount, the magnetic reed switch is separated from proximity to the magnet. The reed switch is thus de-energized, and the ASIC input transits from a logic low state to a logic high state, (provided the viewing device has been turned on). The transition from low to high is interpreted by the logic in the ASIC as a command to turn the intensifier off, causing the latching flip-flop 7 to close, grounding the gate electrode of the power FET 3. The power FET 3 ceases to conduct, turning off the intensifier and turning off the infrared illuminator and indicator, if on. Once the ASIC turns the intensifier off, the user must switch the viewing off and back on to restore the operation of the intensifier.

The low battery indicator provides a visual warning to the user that the battery is in need of replacement, prior to the time when the intensifier would fail due to lack of sufficient operating voltage. The low battery indicator circuit in the ASIC makes use of the voltage reference 10 and an additional comparator like the comparator 9. The battery voltage is fed through a voltage divider resistor pair in the ASIC to an input of the additional comparator. The other input of the comparator is fed by the voltage reference 10. When the divided battery voltage falls below the level of the reference voltage, the comparator causes intermediate outputs from the counter 20 to be combined to form a pulsing current waveform that flashes the low battery indicator LED. The flashes from the LED are visible through a small hole in the turning mirror associated with the eyepiece for the user's right eye. The tap at the junction of the divider resistor pair in the ASIC is connected to an input of the ASIC. This input makes is possible to adjust the voltage threshold at which the low battery indicator begins to flash. The tap of a divider resistor pair or potentiometer external to the ASIC is connected to the ASIC input. Trimming either of the divider resistors or adjusting the potentiometer changes the voltage threshold, and enables the threshold to be precisely set to the desired value regardless of manufacturing variations in the ASIC.

The infrared (ir) illuminator enables the user to illuminate a very dark area with infrared illumination which the image intensifier can "see", but which is invisible to the human eye. The illuminator comprises an infrared emitter diode which is mounted in an aperture in the AN/PVS-7 housing, and is aimed forward to illuminate the field of view of the intensifier. In addition to the illuminator a visible LED serves as an infrared indicator to warn the user that the infrared illuminator is in use. In similar fashion to the low battery indicator LED, the infrared indicator LED is visible through a small hole in the turning mirror associated with the eyepiece for a user's eye. The infrared illuminator and infrared indicator are switched on via the third position on the off/on/ir switch. The user can activate ir momentarily by rotating the switch knob to the ir position, or can activate ir continuously by pulling and rotating the switch knob to the ir position. The ir position on the switch applies battery power to the ir illuminator, ir indicator, as well as to the intensifier and associated circuits. The power returns for the ir illuminator, ir indicator, and intensifier are through the power switching FET 3 so that the high light cutoff and flip-up cutoff circuits can deactivate these functions.

However, a number of problems associated with prior art night vision devices currently exist. Such problems include the lack of a variable gain feature, and a night vision device operable in a small, lightweight package, such as a monocular. The monocular enables the user to keep one eye dark-adapted for a wide-field view, while using the monocular with the other eye to see specific details, even in shaded areas. The variable gain feature allows the user to maintain partial dark-adaptation, if desired, in the eye using the intensifier, and allows the user to defeat the automatic brightness control function in the intensifier, which some users find to be annoying. The reduced size and weight of a monocular, as compared to a binocular, improves the maneuverability of the user, and reduces fatigue. The flexibility of the monocular to be mounted to a rifle, as well as to be mounted to the head or helmet and used with either eye, as well as to be used hand-held, expands its utility for the user.

Further, in systems which have interchangeable tubes and variable gain, it is preferable that any tube be capable of installation in any system and yet retain the same maximum and minimum gain limits, with no adjustment of limits required. The ability to replace or interchange tubes without requiring gain limit adjustments means that maintainers can do their work faster and with less support equipment, reducing maintenance costs.

The monocular device according to the present invention eliminates the size and weight associated with the mounting adapter, output optical splitter, image erector, and mirrors associated with the bi-ocular viewer. In addition, this monocular capitalizes on the small size and light weight of the MX-10160 image intensifier tube, as compared to the larger MX-10130 tube used in the AN/PVS-7 system. The monocular features are described in more detail in a commonly assigned related patent application, entitled IMPROVED MONOCULAR NIGHT VISION DEVICE, and incorporated herein by reference. The MX-10160 tube is modified to include the ability for the user to adjust the intensifier's gain to any desired value between specified upper and lower limits, which can be factory-preset. The factory-preset tubes are interchangeable in monoculars, without requiring the maintainers to adjust the preset gain settings. The variable gain tube is described in more detail in a related patent application, entitled VARIABLE GAIN IMAGE INTENSIFIER, and also incorporated by reference.

According to the present invention, a novel electronic circuit to be used in conjunction with the monocular makes use of the items previously developed for the AN/PVS-7, and adds provisions for variable gain, without requiring the maintainers to adjust the monocular circuit when replacing the intensifier tube. In addition, the novel circuit achieves reduced size and improved producibility by including all functions, except for the switches, batteries, and gain control, on one rigid printed circuit board (pcb). The switches, batteries, and gain control are interconnected by a single flexible pcb which interconnects to the rigid pcb. This approach eliminates hand wiring, enables simplified, quicker assembly, and improves reliability by eliminating wire joints which can be prone to flexural fatigue failure or short circuits caused by loose strands.

To reduce size and weight of the monocular, the head/helmet mount adapter is made part of a detachable mounting arm. Such a feature imposes additional requirements on the circuit, as the magnetic reed switch does not reside in the main housing, but is now in a detachable mounting arm. The circuit includes features for enabling the detachment while protecting from damage and preventing inadvertent turn-off during the periods when the mounting arm is detached. In this invention, components and features are added to the flip-up cutoff circuit to harmlessly absorb any electrostatic discharges (esd) to the contacts and to prevent unintended turn-off events. In the present invention, the flip-up cutoff circuit contacts on the monocular housing are recessed slightly below the mounting surface to protect the contacts from mechanical damage and to prevent electrical contact to a small arms mounting adapter, which does not include a flip-up cutoff function. Further, the number of connections to the reed switch is reduced from three to two, and new filtering provisions have been added to prevent magnetic reed switch bounce from causing unintended turn-off events.

SUMMARY OF THE INVENTION

It is an object of the present invention to provide an electronic circuit for use in a monocular night vision device for electronically controlling a plurality of components within the device, the device having an objective lens assembly for receiving low intensity light, an image intensifier assembly comprising a variable gain image intensifier tube having a user-adjustable variable gain controller external to the tube for adjusting the light intensity level of a visible output image, a single eyepiece lens assembly for viewing the output image from the image intensifier assembly; and a non-metallic housing comprising an upper housing for receiving the objective lens assembly, image intensifier assembly, and eyepiece lens assembly, and a lower housing containing a battery cavity for receiving at least one battery to power the device, wherein the housing aligns the objective lens assembly with the image intensifier assembly and the eyepiece lens assembly along an optical axis, and wherein the upper and lower housing are coupled to one another along the optical axis, the electronic circuit comprising a rigid printed circuit board (pcb) located within the lower housing having a plurality of contacts for enabling electronic communication with a plurality of components mounted thereon and with the variable gain image intensifier tube, the rigid pcb including a pair of contacts in electrical communication with the image intensifier tube for energizing the intensifier tube; and a flexible printed circuit board flexibly coupled to the rigid pcb and adaptable to the geometry of the upper and lower housings for electronically interconnecting components located within the upper and lower housings with the rigid pcb, the flexible pcb having a first circuit connection to the image intensifier tube and a second circuit connection to an adjustable potentiometer mounted external to the image intensifier tube on the rigid pcb, the flexible pcb operative for coupling the adjustable gain potentiometer mounted external to the image intensifier tube to the rigid pcb via first and second connections.

It is a further object of the present invention to provide in a monocular night vision device having an objective lens assembly for receiving low intensity light, an image intensifier assembly comprising an image intensifier tube, a single eyepiece lens assembly for viewing an output image from the image intensifier assembly, and a non-metallic housing comprising an upper housing for receiving the objective lens assembly, image intensifier assembly, and eyepiece lens assembly, and a lower housing containing a battery cavity for receiving at least one battery to power the device, wherein the housing aligns the objective lens assembly with the image intensifier assembly and the eyepiece lens assembly along an optical axis, and wherein the upper and lower housing are coupled to one another along the optical axis, an electronic circuit for electronically controlling said monocular device comprising a rigid printed circuit board (pcb) located in the lower housing having a plurality of electronic components mounted thereon and including an ASIC; a single flexible pcb connected to the rigid pcb at a plurality of predetermined contact points on the rigid pcb for coupling components located external to the rigid pcb with the rigid pcb; and interface means for electronically coupling a peripheral electronic assembly having a magnetic reed switch and a connecting circuit to the monocular night vision device.

DETAILED DESCRIPTION OF THE INVENTION

Before embarking on a detailed discussion, the following should be understood. The circuit according to the present invention is operable within a night vision device, and preferably within a night vision monocular such as the AN/PVS-7 night vision monocular, as well as with the night vision device depicted in co-pending application Ser. No. 09/074,238 entitled IMPROVED MONOCULAR NIGHT VISION DEVICE, the details and operation of which are incorporated herein by reference. As such, a monocular night vision device incorporating the circuit of the present invention will be described with reference to the drawings.

Figure 1:
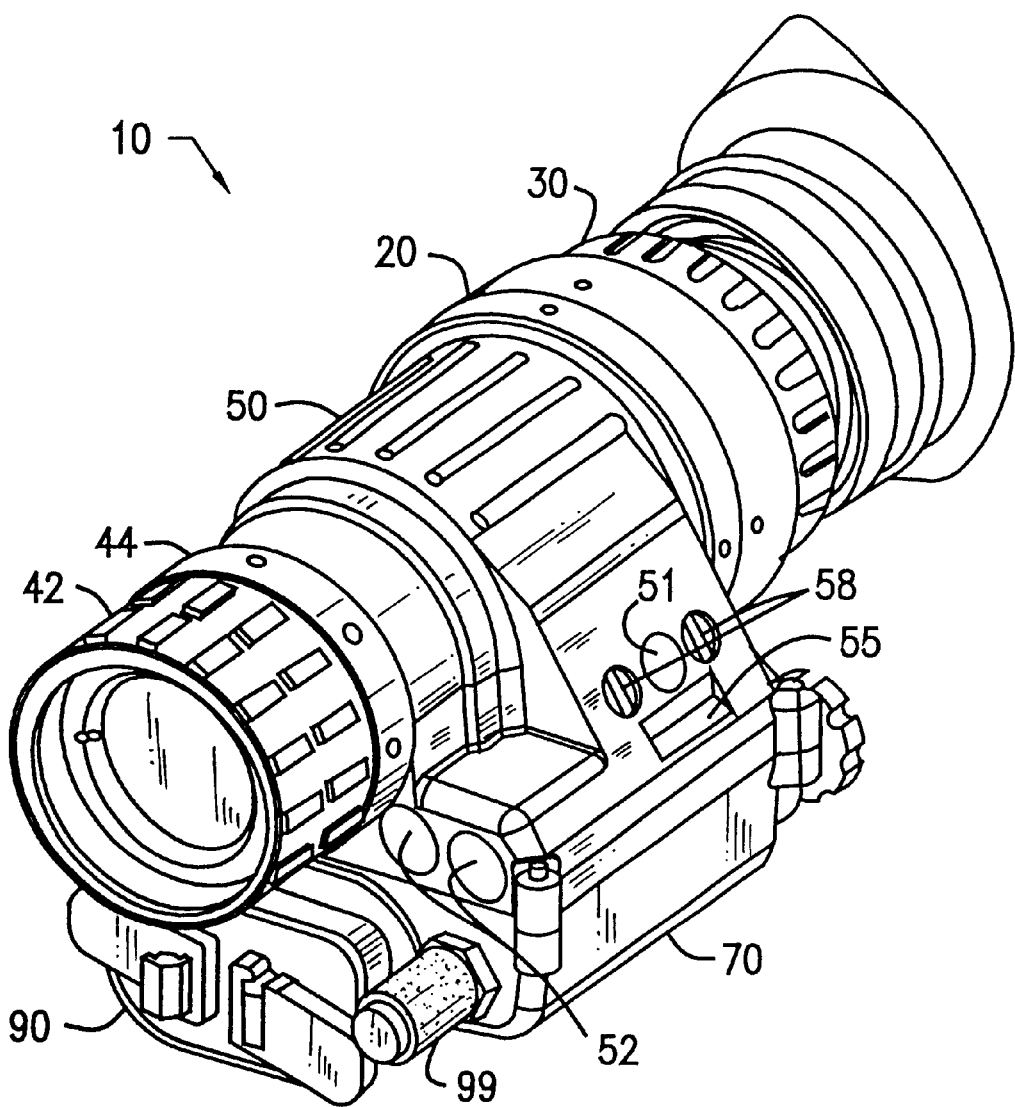
FIG. 1 is a perspective view of the MNVD according to the present invention.
Figure 2:
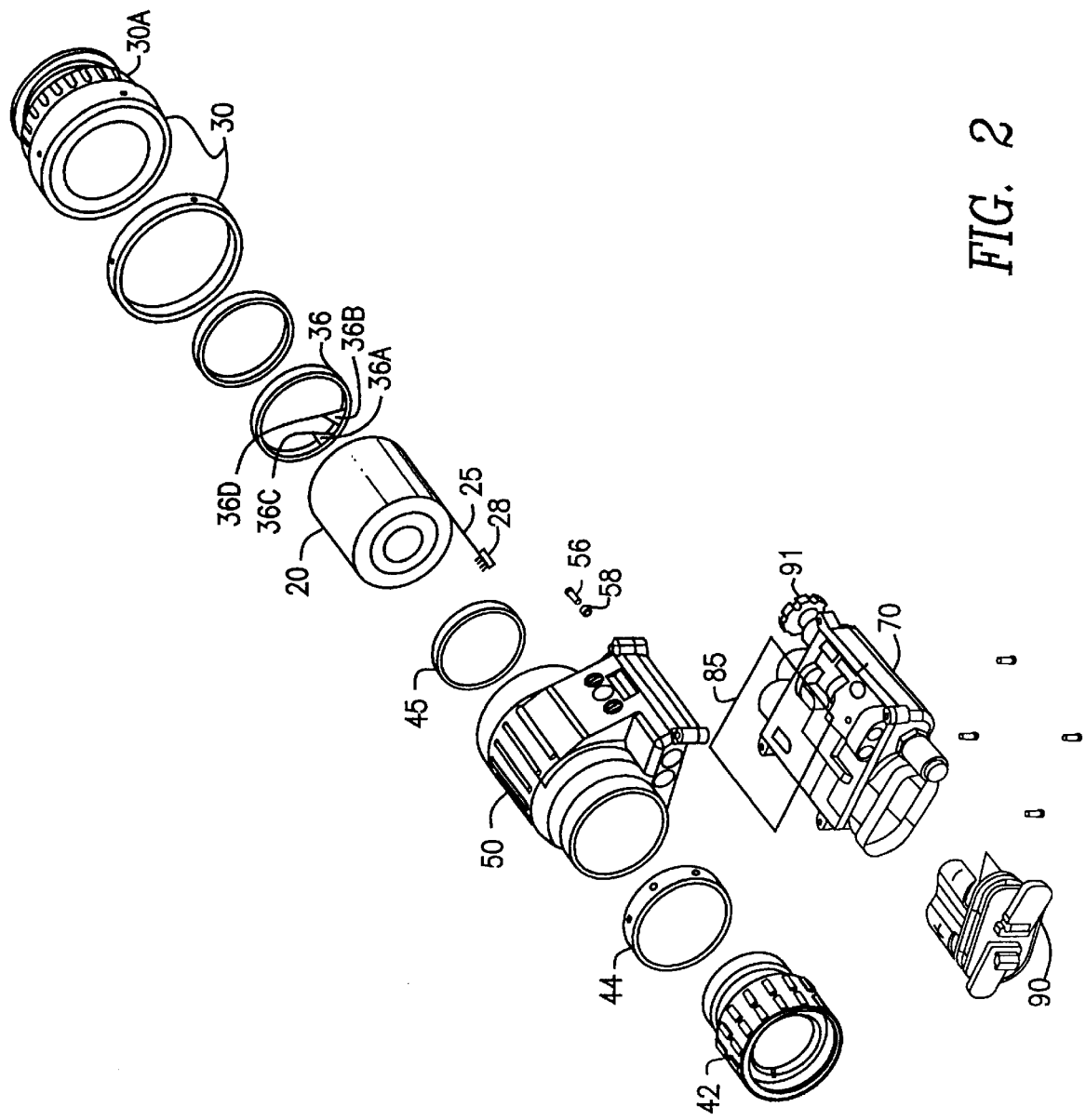
FIG. 2 is an exploded view of the MNVD of FIG. 1.

A monocular night vision device 10 according to the present invention is shown in FIG. 1. This device 10 is compact, lightweight, and comfortably fits into a user's hand. The device can be hand held, head or helmet mounted, or mounted onto a weapon such as a rifle. These capabilities provide a versatile monocular night vision device with a wide variety of usage modes. FIG. 2 provides an exploded view of the elements comprising the MNVD 10 of FIG. 1. Note that, when referring to the drawings, like parts are indicated using like reference numerals.

Figure 3:
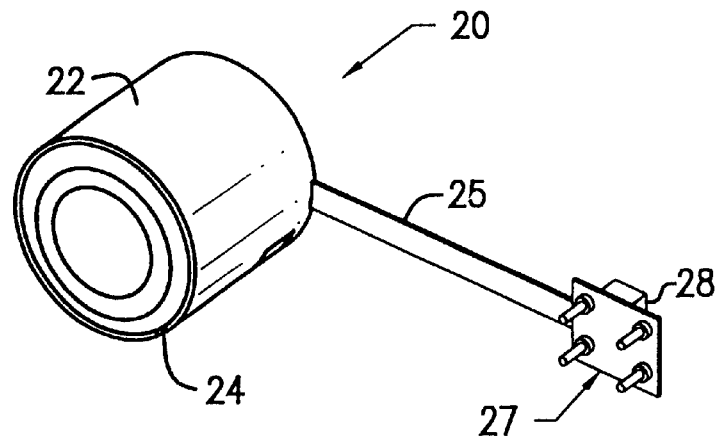
FIG. 3 is an illustration of the variable gain image intensifier incorporated into the MNVD of the present invention.

Referring now to FIGS. 2 and 3, the MNVD 10 includes an image intensifier 20 (see FIG. 11) which has the same performance as a conventional MX-10160 intensifier, but provides the capability for the tube gain to be varied by the user. This is accomplished through an externally mounted adjustable potentiometer 28. The image intensifier 20 is attached to a flexible printed circuit board (pcb) 25 with a four pin connector 27 positioned external to the cylindrical body 22 to provide power to the intensifier tube. A tube alignment pin 60 ensures proper alignment of the image intensifier tube with the upper housing.

External Gain Control knob 99 extending from the front 85 of the lower housing allows a user to variably adjust the gain of the image intensifier tube 20 to the desired level for optimal performance. A conventional eyepiece lens assembly 30, such as the AN/AVS-6 eyepiece lens, is incorporated into the monocular night vision device 10. This eyepiece provides 25-mm eye relief which is optimal for use in weapon firing or with NBC (nuclear/biological/chemical) gear. An eyepiece adapter 30A is attached to the rear of the eyepiece which allows for fastening an eyecup or eye guard and a demist shield 41 (FIG. 4B).

The monocular night vision device 10 further incorporates an objective cell assembly 40 comprising an objective lens assembly 42 and infinity focus stop ring 44, having the same optics as a conventional AN/AVS-6 objective cell assembly. This allows for high optical performance of the device since distortion is minimized between the standard AN/AVS-6 eyepiece and objective optics. However, the optics of device 10 are packaged into a lens cell housing having the same external features and dimensions as the AN/PVS-7 lens cell housing. This allows for identical focus adjustment of the AN/PVS-7 and incorporation of the standard AN/PVS-7 objective focus knob and external cell threads for accepting standard AN/PVS-7 accessories. A close focus stop ring 45 is fastened to the inside of the objective cell lens assembly.

Figure 4A:
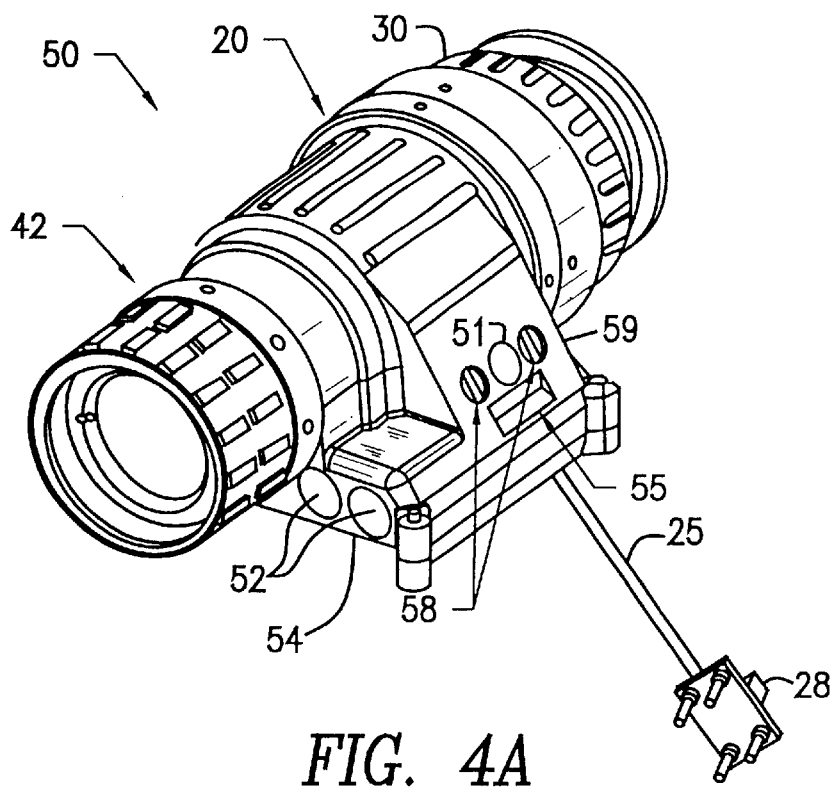
FIGS. 4A and 4B are top and bottom perspective views of the upper housing assembly.
Figure 4B:
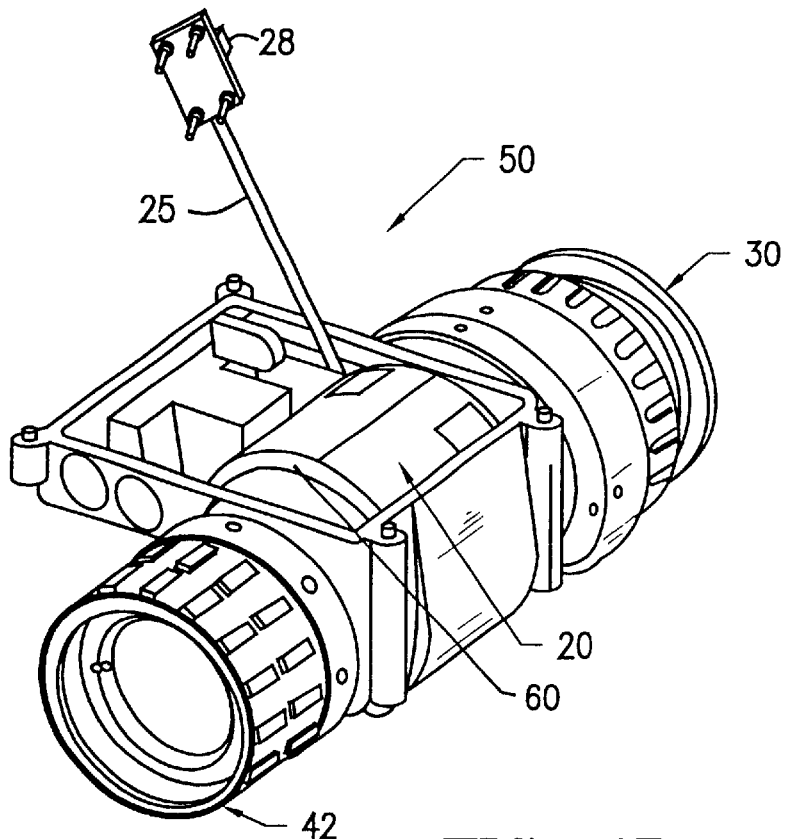
Figure 5B:
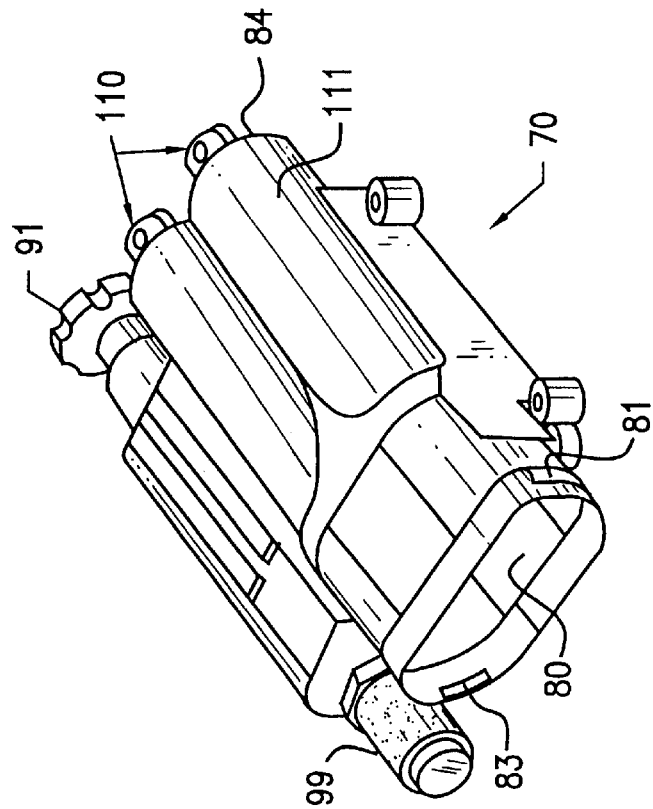
FIGS. 5A and 5B are top and bottom perspective views of the lower housing assembly.
Figure 5A:
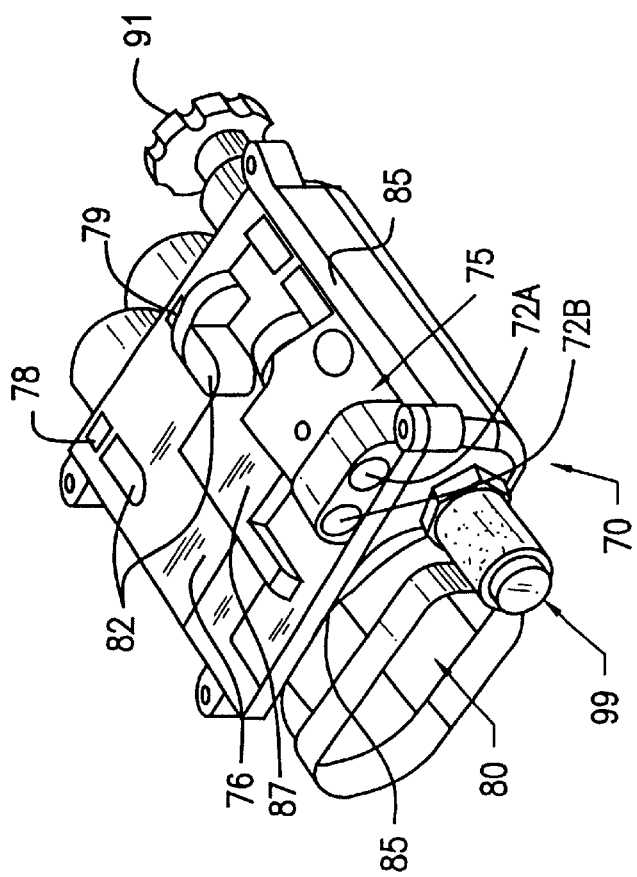

As best shown in FIGS. 2, 4, and 5, the main body of the monocular night vision device 10 consists of an upper housing 50 and lower housing 70. The upper and lower housings are separated along the optical axis of the system, such that upon assembly, the housings are coupled along said axis. The upper housing 50, as shown in FIGS. 4A–B, holds the objective lens assembly 42, image intensifier 20, and eyepiece lens assembly 30. The lower housing, as illustrated in FIGS. 5A–B, holds the electronics 76 and the battery cavity 80. This design of a split upper and lower housing provides for ease of assembly and maintainability.

As shown in FIG. 2, an o-ring 85 fits onto and engages oppositely disposed surfaces of the upper 50 and lower 70 housings to provide an environmental seal between the upper and lower housings.

Referring again to FIG. 4A, two clear circular windows 52 are positioned on the front face 54 of the upper housing 50. These windows align with an IRLED 72A and photo transistor 72B assembled onto a rigid printed circuit board within the lower housing (FIG. 5A). The IRLED 72A is activated by OFF/SYSTEM ON/MOMENTARY IR ON/LOCKED IR ON switch 91 via the electronics to provide forward projecting light for additional illumination. This is particularly useful for operations conducted in virtually total darkness. Photo transistor 72B is operable to sense light intensity incident onto its window indicative of daylight or sunlight, and in response to sensing an amount of light intensity exceeding a predetermined threshold, operates via the electronics in the lower housing to turn off the night vision device 10, thus protecting the image tube from burn-in. More particularly, photo transistor 72B provides a signal indicative of the amount of sunlight detected at the photo transistor to a sensor circuit on printed circuit board 76. The sensor circuit then compares the received signal with a predetermined threshold value. If the signal exceeds the threshold value, the intensifier tube is turned off, thereby protecting the image tube and extending the life of the device.

An environmentally sealed purge screw 56 and o-ring 58 (FIG. 2) is located on the rear face 59 of the upper housing 50 which has a cavity (not shown) into which the screw is inserted. The purge screw permits the monocular night vision device 10 to be environmentally purged after assembly of the system is complete. This is done, for example, in order to compensate for differences in atmospheric conditions between device field operation and the manufacturing facility.

As best shown in FIG. 2, the upper housing assembly optically aligns a light transmitting ring 36 between the image intensifier 20 and eyepiece lens assembly 30 for transmitting light from LEDs 78 and 79 on lower housing 70 outside the user's optical field of view. Light transmitting ring 36 in the preferred embodiment, is cylindrical in shape and made of a clear material such as acrylic to permit light from remote visible indicators (LEDs)78 and 79 at the lower housing assembly 70 to be transmitted to the peripheral field of view of the user. Flats 36A and 36B on the outside diameter of the light transmitting ring accept light from respective LEDs 78, 79 and transmit the light to flats 36C and 36D respectively on the inside diameter. The transmitted light is thereby transmitted along the optical path and thus appears in the user's field of view, thereby providing a signal to the user. The ring is positioned as illustrated in FIG. 2 and oriented with respect to the lower housing assembly 70 such that flats 36A and 36B are vertically aligned with respective LED indicators 78 and 79. In this manner, the LED indicators might be housed within the compact lower housing assembly and out of the direct field of view of the user, while still permitting the light emitted from the respective indicators to be received and viewed at the eyepiece. An alignment tab on the light transmitting ring ensures proper alignment with the upper housing.

Referring to FIG. 5A, the lower housing assembly, as previously discussed, includes a rigid printed circuit board (PCB) assembly 76 fastened directly thereto. Several interfacing electrical components are located on the upper side of the rigid PCB. A plastic housing or carrier 74 is located on the PCB which holds conventional IRLED 72A and photo transistor 72B. Also on the rigid PCB are conventional tube contacts 82 as used in the AN/AVS-6 tube which provide electrical connection to the image intensifier. Two LEDs 78, 79 on the PCB provide indication of low battery power and activation of the IRLED, respectively. A low battery sensor circuit 108 of the conventional type is included within the electronics on lower housing 70 for periodically measuring the power output from the batteries and comparing the measured power with a predetermined threshold. When the measured battery power drops below the predetermined threshold, the battery sensor circuit is operable to activate LED 78 to provide a signal indicative of the low battery condition. The signal is transmitted into the user's field of view via the lighttransmitting ring 36 from low battery power LED 78. Note also that the PCB incorporates a four socket connector 75 for tube variable gain which aligns with and accepts the four pin connector from the image intensifier, as will be further discussed.

Lower housing 70 further comprises a battery cavity 80 designed to hold batteries and oriented in-line with the optical axis. The opening for the battery cavity is integral with the front face 85 and provides a monocular night vision device that is comfortable to hold in the hand. Preferably the battery cavity holds two AA batteries. Use of two AA batteries provides both a worldwide common battery, as well as extending battery life under severe cold conditions.

The lower housing 70 further contains a flex circuit assembly 87 consisting of a flexible pcb which provides for electrical contact between system components. This flex circuit assembly 87 electrically connects standard rotary switch 91 as employed in the AN/PVS-7 system with the battery power supply. This switch provides the following controls: OFF/SYSTEM ON/MOMENTARY IR ON/LOCKED IR ON. The SYSTEM ON mode is reached by turning clockwise from the OFF position. When the switch is positioned to SYSTEM ON mode, the tube is operational; however, the IR capability is non-functional in this mode. The switch is spring loaded such that turning of the switch knob 91 in the clockwise direction for SYSTEM ON mode activates the MOMENTARY IR ON mode to permit IR signaling. In this manner, one may use the MOMENTARY IR ON mode to send Morse Code or other such signaling in a covert manner. Locked IR ON mode provides continuous IR feature and is enabled by pulling the switch knob towards the user and turning in a clockwise manner to allow engagement of this mode. Note that the switch is electrically coupled to potentiometer 27 (FIG. 3) for adjustment of the image intensifier's gain level. Two female pin connectors are also part of the flex circuit assembly. These connectors are attached to the two contacts 82 in the upper housing assembly when the upper and lower housings are assembled. FIG. 13 provides a circuit schematic of the electronics in the lower housing including the PCB and contact points/terminals.

FIG. 4A further shows a mounting socket 51 on the outer surface 53 of upper housing assembly 50 for mounting to an apparatus such as a head/helmet mount adapter or small arms mounting adapter. Preferably, mounting socket 51 is a ¼" threaded insert. Proximal to the mounting socket, and preferably directly below, on surface 53, is a triangular alignment feature 55 which aids in both aligning and orienting the head/helmet mount adapter or small arms mounting adapter. Two contacts 58 positioned adjacent to the mounting socket provide electrical contact between the monocular night vision device 10 and the head/helmet mount adapter.

Figure 8A:
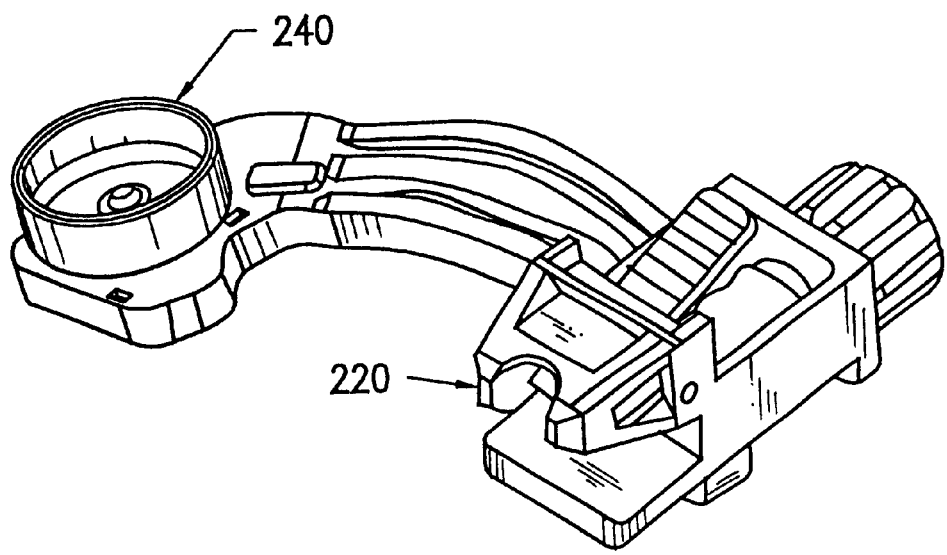
FIGS. 8A and 8B are top and bottom isometric views of the head/helmet mount adapter of the MNVD system.
Figure 8B:
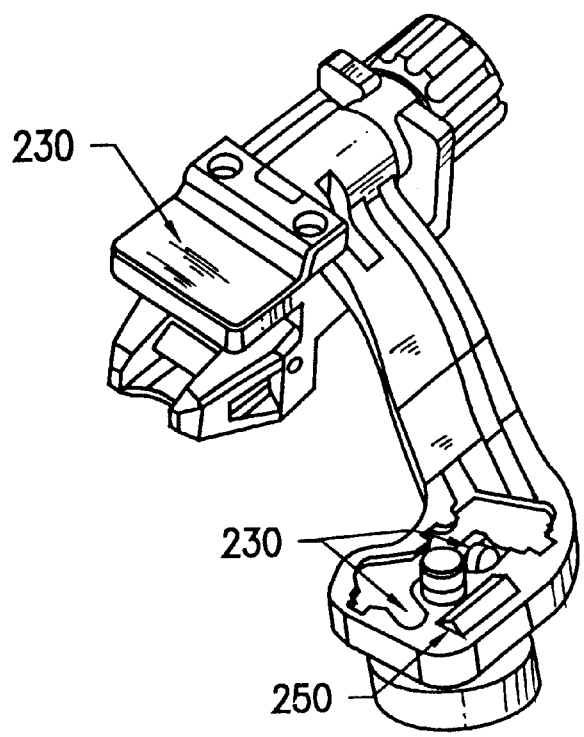
Figure 9:
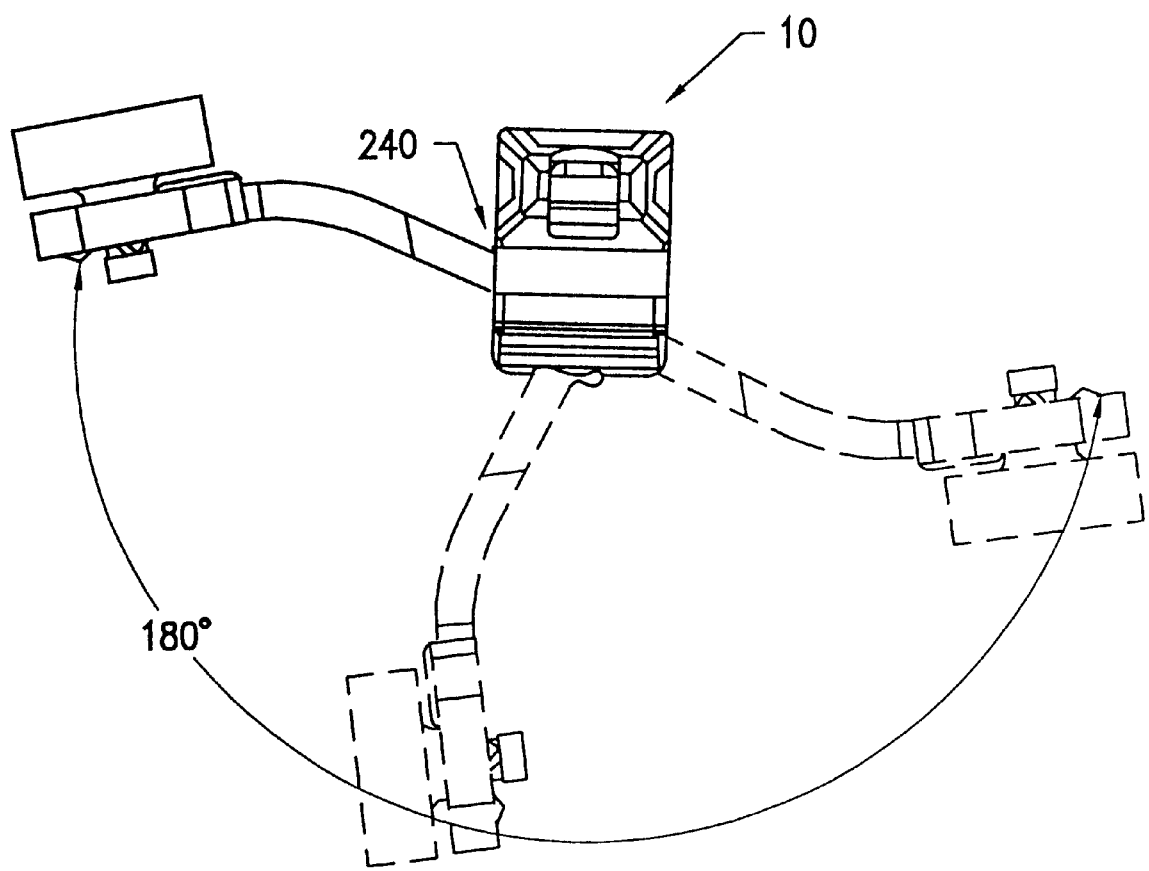
FIG. 9 is an illustration of the rotational movement of the MNVD head/helmet mount adapter.
Figure 10:
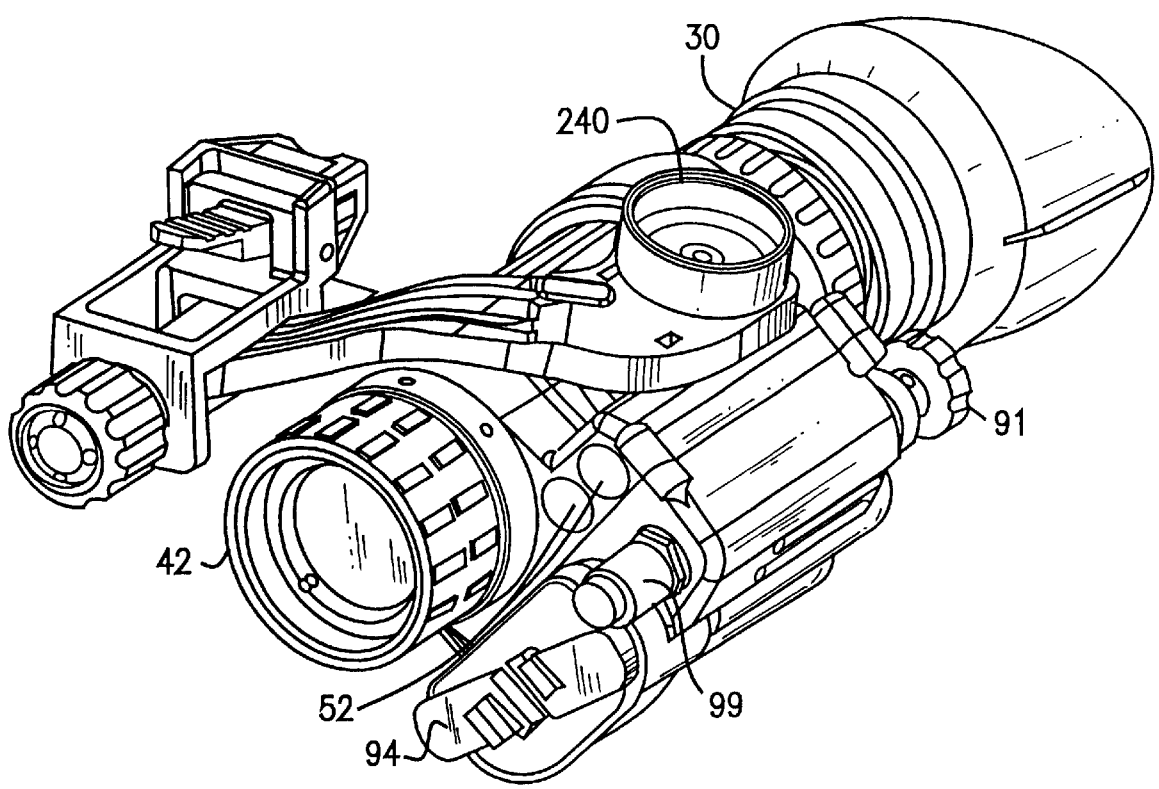
FIG. 10 is an illustration of the head/helmet mount adapter fastened to the MNVD of the present invention.

FIGS. 8A–B illustrate a head/helmet mount adapter 200 for coupling to the monocular night vision device 10. This adapter allows the monocular night vision device to be mounted to a standard AN/PVS-7 head mount or helmet mount. An adjustable mounting arm 210, which can be rotated 180 degrees (see FIG. 9) allows the monocular night vision device to be positioned in front of either the left or right eye as shown in FIG. 10. This adapter incorporates a mounting horn 220 and mounting latch 228. A magnetic reed switch 230 positioned beneath mounting horn 220 operates to turn off the monocular night vision device when removed from the headmount or helmet mount or when flipped-up in the helmet mount. A cable assembly runs from the reed switch 230 down the mounting arm 210 and to a set of contacts 232 at the opposite end of the mounting arm. These two contacts align with the contacts 58 on the upper monocular housing surface 53 when the adapter is fastened to the monocular's upper housing. Preferably, a captivated 0.25" thumbscrew allows for fastening the adapter 200 to the monocular night vision device at mounting socket 51. The triangular alignment feature 250 located near the thumbscrew aids in orienting the monocular night vision device to the adapter.

Figure 11:
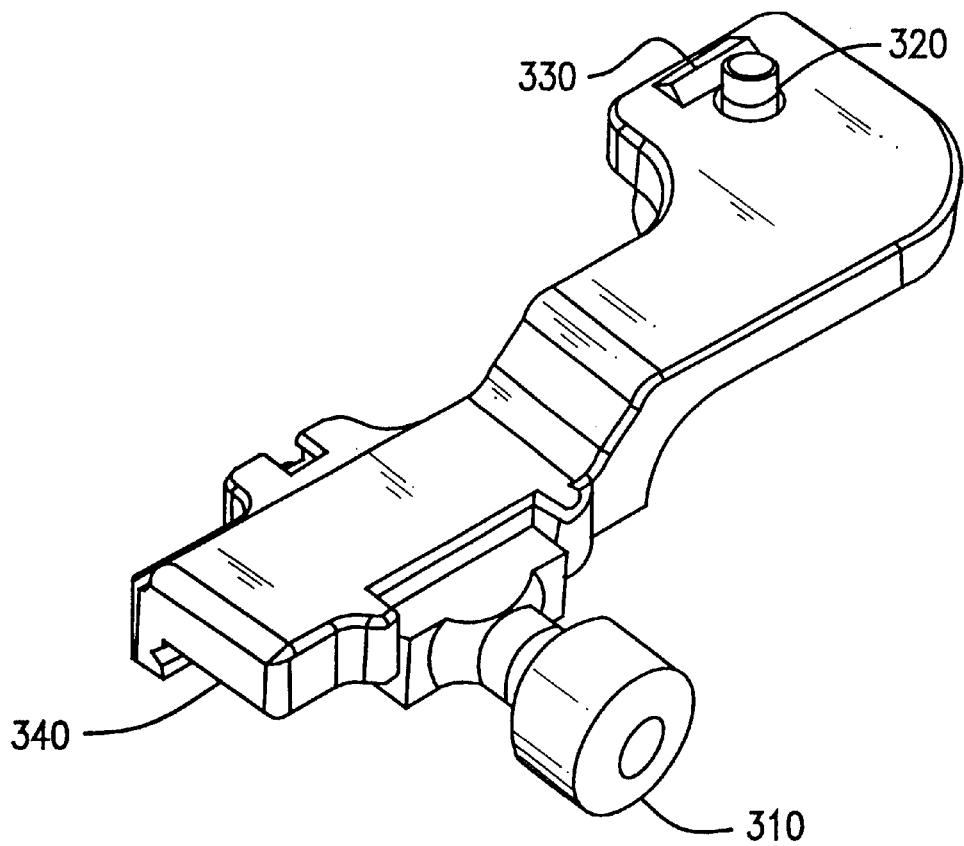
FIG. 11 is an illustration of a small arms mounting adapter for attaching to the MNVD.
Figure 12:
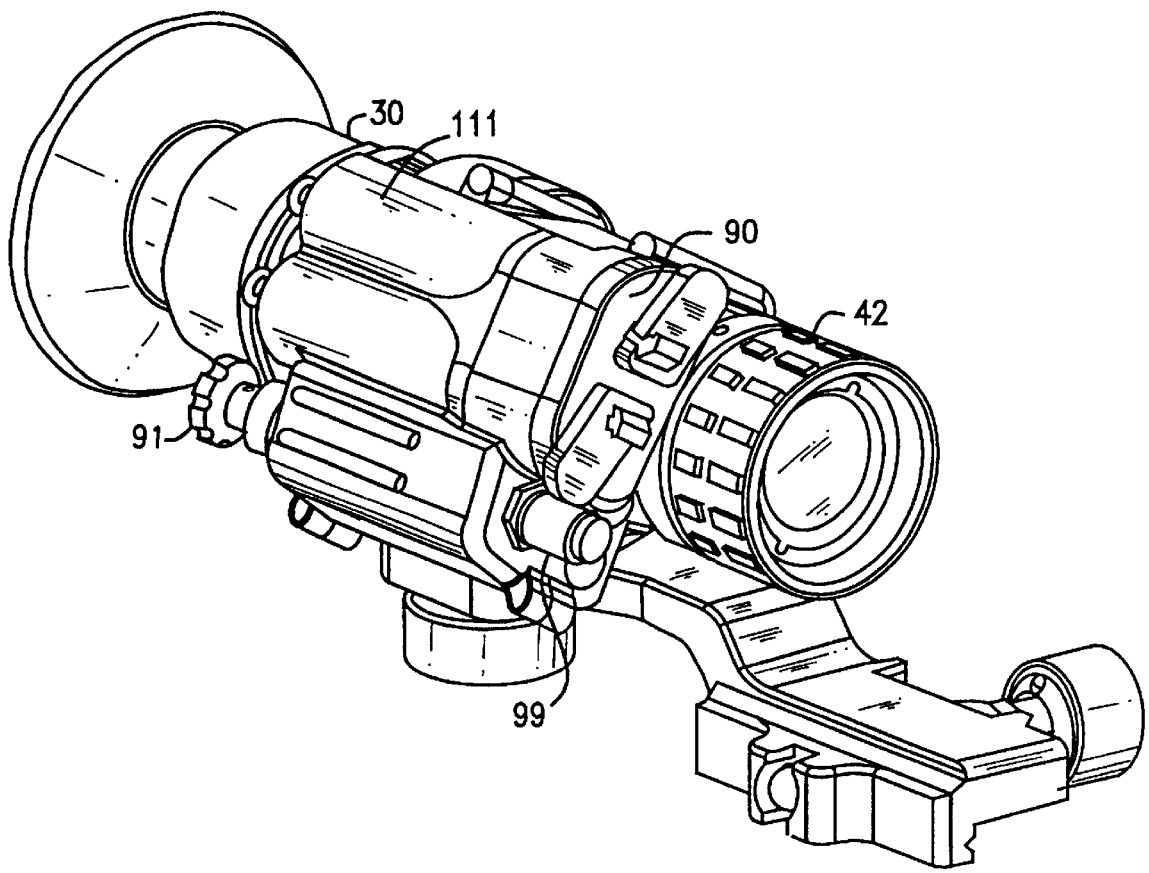
FIG. 12 is a perspective view of the small arms adapter of FIG. 11 connected to the MNVD.

FIGS. 11 and 12 show a small arms mounting adapter 300, incorporated as part of the monocular night vision device 10. This adapter allows for mounting to an M16/M4 receiver rail 340 as configured for the Modular Weapon System Kit and as defined in MIL-STD-1913. The adapter positions the monocular night vision device optimally on the weapon so that the user does not have to change their normal shooting position. The adapter incorporates a torque limiting mechanism in the fastening knob assembly 310 that fastens the adapter to the mounting . rail while preventing a user from over-tightening the fastening knob assembly. Preferably, a captivated 0.25" thumbscrew 320 allows for fastening the adapter to the monocular night vision device at mounting socket 51. Triangular alignment feature 330 located proximal the thumbscrew 320 aids in orienting the monocular night vision device to the adapter and also helps to keep the monocular night vision device properly oriented during weapon firing.

Figure 7:
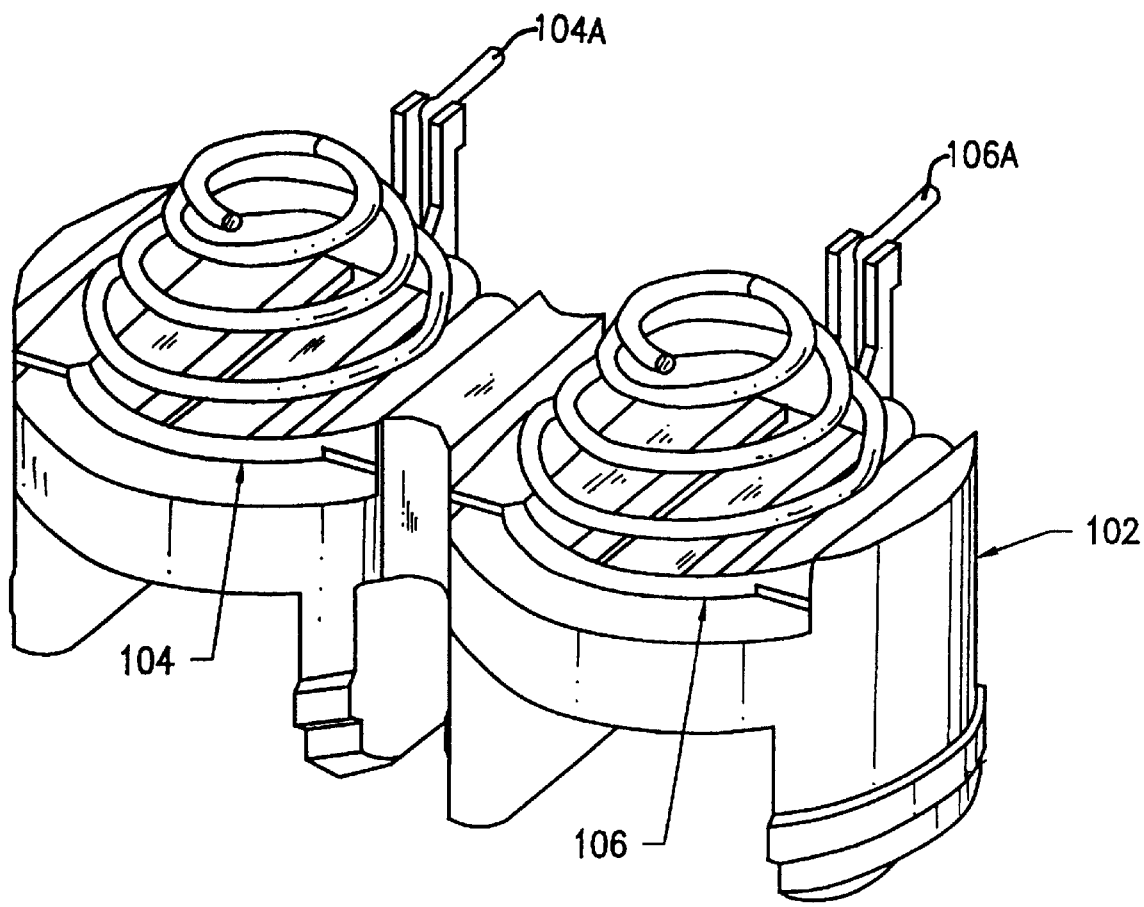
FIG. 7 is an illustration of the battery spring assembly connectable to the flexible circuit according to the present invention.
Figure 13A:
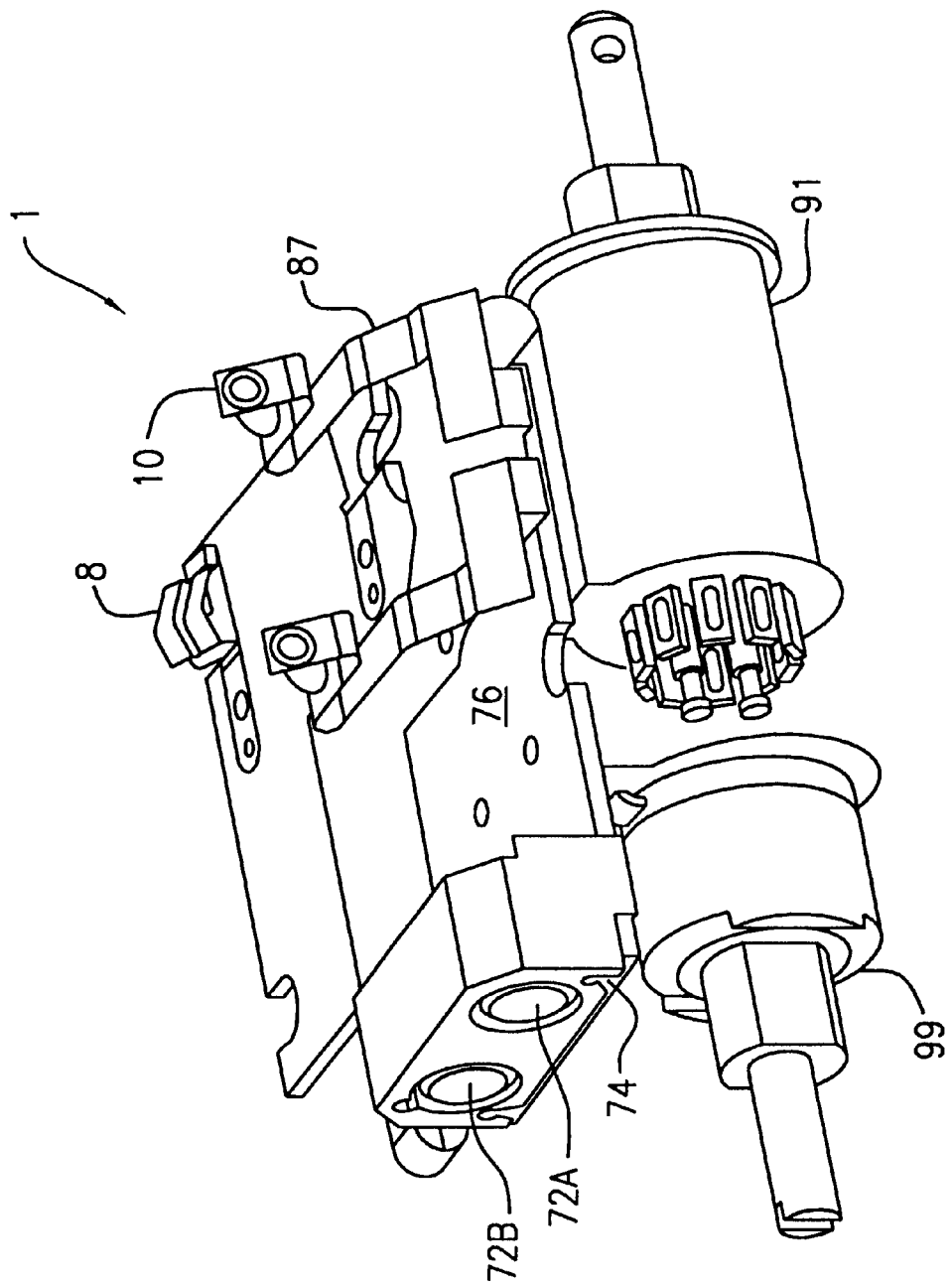
FIGS. 13A–B are a schematic illustration of terminal connections associated with the electronic circuit board of the lower housing of the MNVD according to the present invention.
Figure 13B:
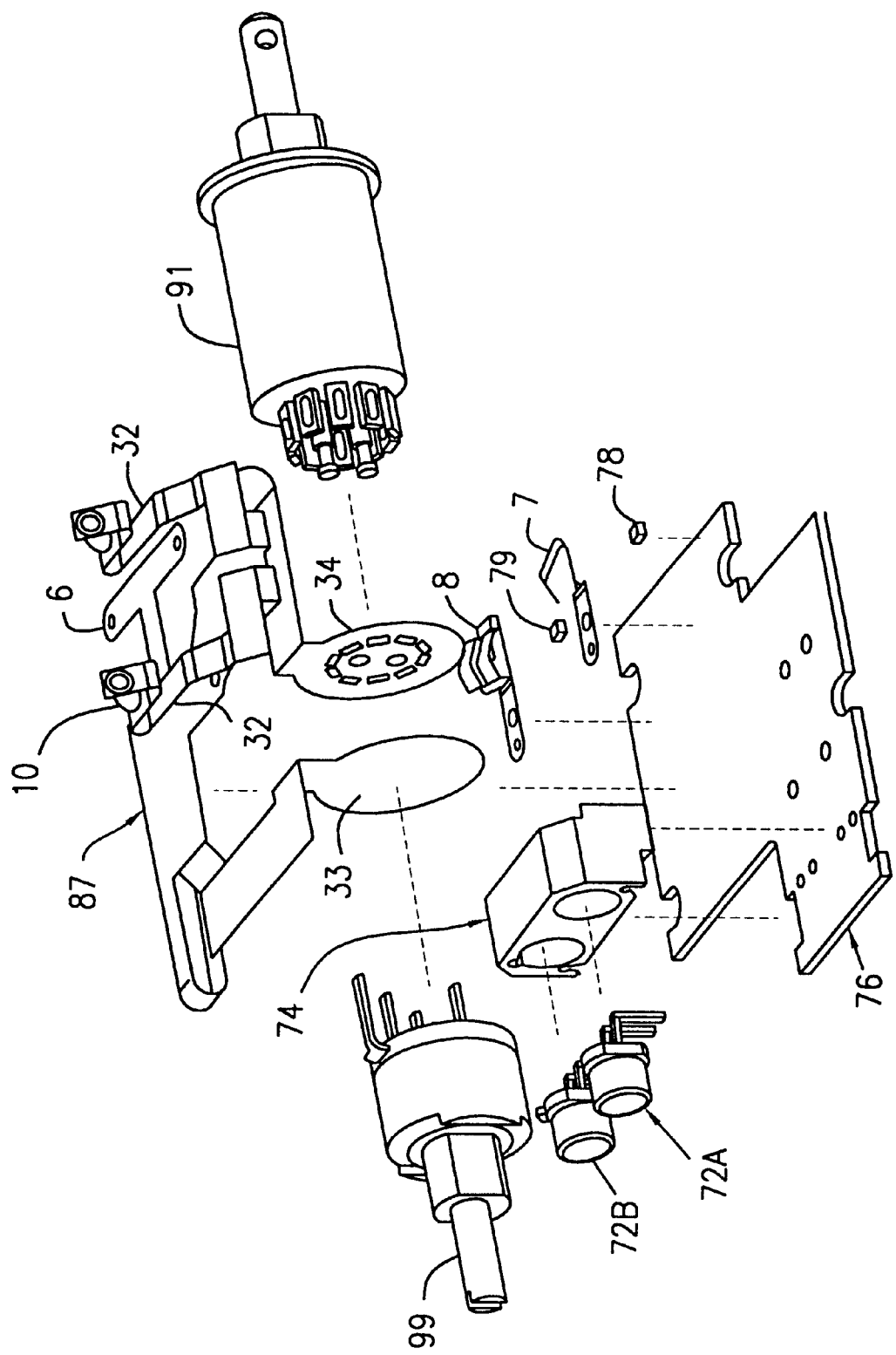

FIGS. 13A–B illustrate overall assembled and exploded views respectively, of the electronic circuit 1 comprising the rigid printed circuit board (pcb) 76 and flexible pcb circuit 87 embodied in a night vision device according to the present invention. Referring to FIG. 13B, rigid pcb 76 supports most of the device components. Connections to the main on/off/ir switch 91, the variable gain control 99, and sockets 10 which mate to external contacts for the magnetic reed switch (not shown) are part of the flexible pcb 87. In addition, the flexible pcb 87 has an arm portion ending in a T-shaped segment 6 which makes the connections to spring contacts 104, 106 at points 104A and 106A of the batteries as shown in FIG. 7. This arm portion operates to eliminate the need to hand-install separate wires to the battery contacts as in done in prior art devices, including the AN/PVS-7. Other major components which are mounted on the rigid pcb include infrared illuminator diode 72A, light sensor 72B, left and right spring contacts 7 and 8 which help provide + and – electrical power to the intensifier tube, infrared indicator LED 78, and a low battery indicator LED 79. Such parts had been installed on flexible arms in prior art devices, thereby requiring more hand assembly work. The infrared illuminator diode 72A and the light sensor 72B are installed in a carrier 74 made of a resilient material such as plastic which snaps to the rigid PCB. The carrier 74 supports the infrared illuminator diode 72A and light sensor 72B, and holds the diode and sensor in the proper positions to align with windows 52 in the upper housing 50.

Referring now to FIGS. 13A–B in conjunction with FIG. 10, this rigid and flexible pcb assembly integrates all of the control electronics, except for the mounting arm wiring, together in the lower housing assembly 70 of the monocular 10. Only the sockets 10 mate to the external contacts installed in the upper housing 50. The sockets 10 push onto pins which are part of the external contacts. The sockets connect to the rest of the circuit in the lower housing via two flexible arms 32 of the flexible pcb 87, thus, facilitating easy connection or disconnection with the upper housing during assembly or maintenance. Moreover, by mounting the infrared illuminator diode 72A and the light sensor 72B to a carrier on the rigid pcb 76, these components do not require attachment to upper housing 50, even though they illuminate and sense the outside world through the upper housing. The windows 52 (FIG. 4B) in the upper housing provide environmental protection to these parts, while providing optical access to the outside. The main body of the image intensifier tube is likewise mounted in the upper housing, but the spring contacts 7 and 8 bear on the side of the tube and feed power to the tube in the completed assembly.

Figure 14A:
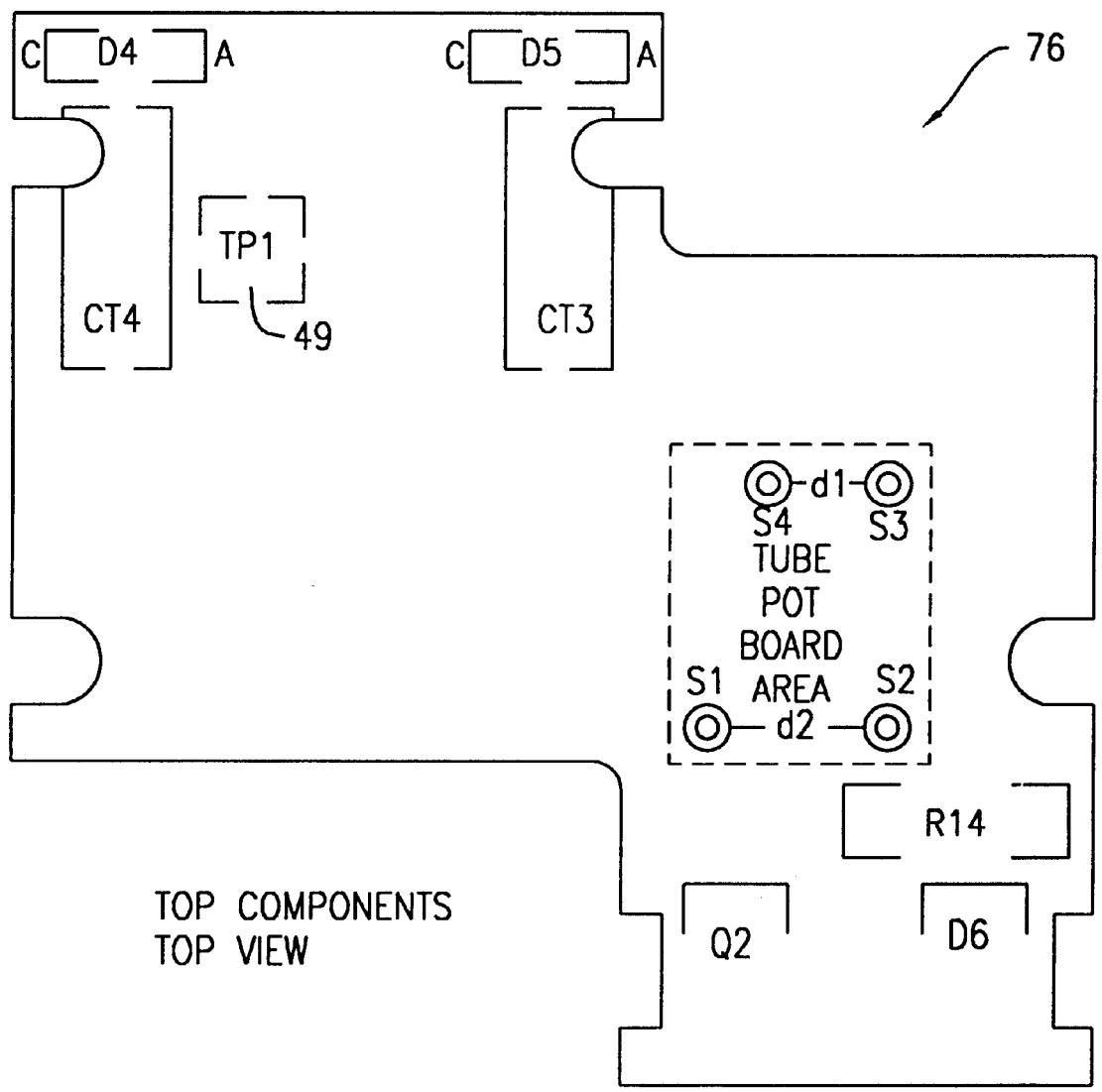
FIGS. 14A and B show top and bottom views respectively of the rigid printed circuit board depicting the positional layout of components.
Figure 14B:
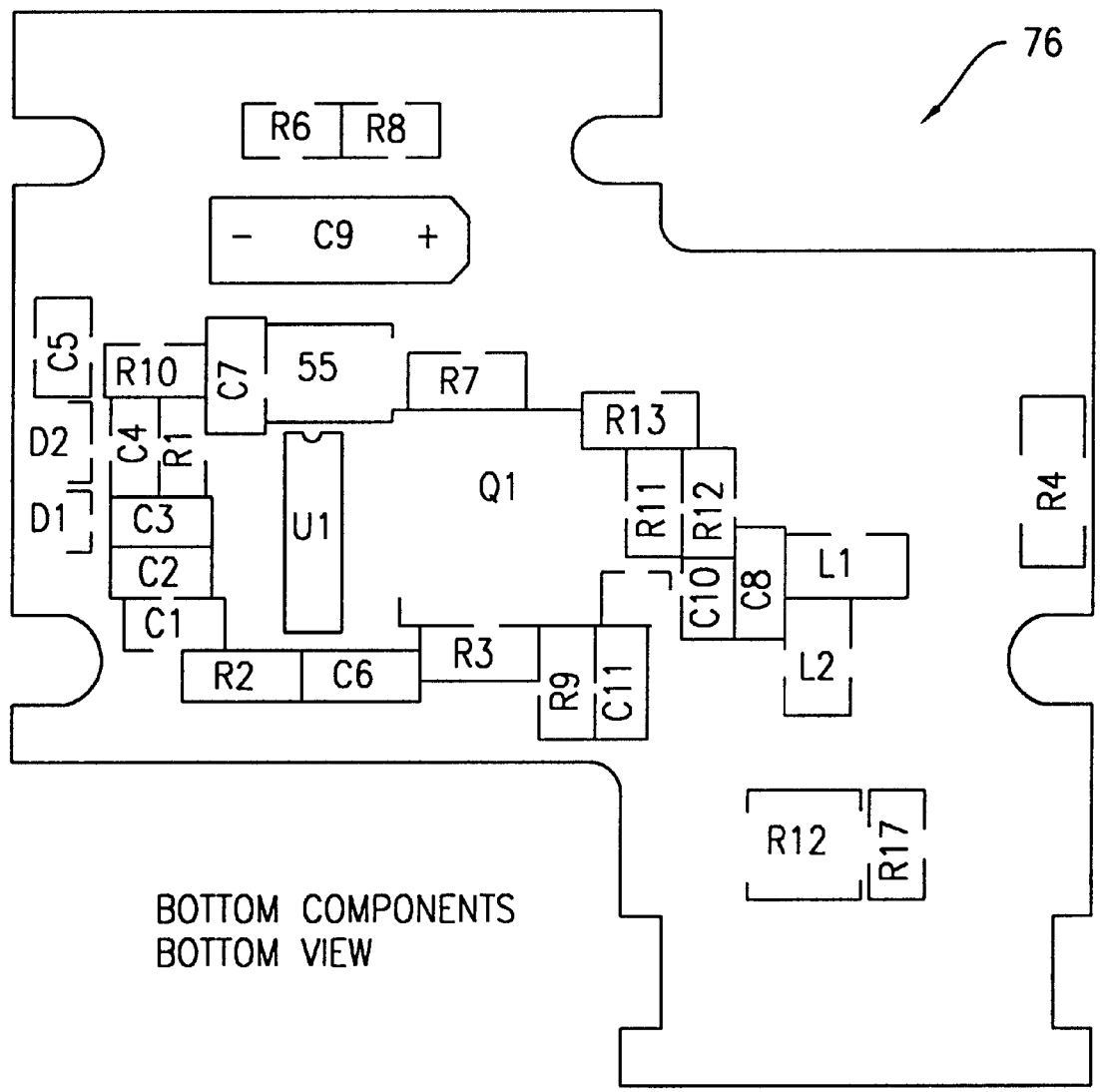

FIGS. 14A–B show top and bottom views respectively of the rigid pcb 76, depicting the positional layout of the components on the board. Most of the circuit components are surface-mount soldered to the bottom side of the rigid pcb. The top side of the rigid pcb serves mainly to support the electro-optical components and to provide connections to the other parts of the circuit. As shown in FIG. 14A, element D6 is the infrared illuminator LED (reference numeral 72A in FIG. 13). Q2 represents the light sensor (reference numeral 72B in FIG. 13). CT3 and CT4 represent the spring contacts (reference numerals 7 and 8 respectively, in FIG. 13). TP1 is not a separate component, but is a test point formed of a plated area 49 on the pcb, which can be momentarily connected to battery negative to reduce the high light cutoff time delay which is typically 70 seconds. This feature reduces test costs by accelerating the testing. [how is testing accelerated? Is this feature new?] A potentiometer board 27 depicted in FIG. 3 associated with the variable gain image intensifier tube plugs into the rigid pcb at sockets S1 through S4. These sockets are arranged such that the distance d1 between S3 and S4 is less than the distance d2 between S1 and S2, where S3–S4 are in substantially parallel planar alignment as are S1–S2. This serves to prevent backwards installation, so that the flexible arm of the tube is always oriented the same way, and so that maintainers are not confused by the possibility of two configurations. The sockets S1–S4 provide mechanical support to the potentiometer board, and this mechanical arrangement of parts enables interchangeability of tubes without the need for the maintainer to readjust any gain limits resistor. The operation of the other components on the pcb are explained below.

Figure 15:
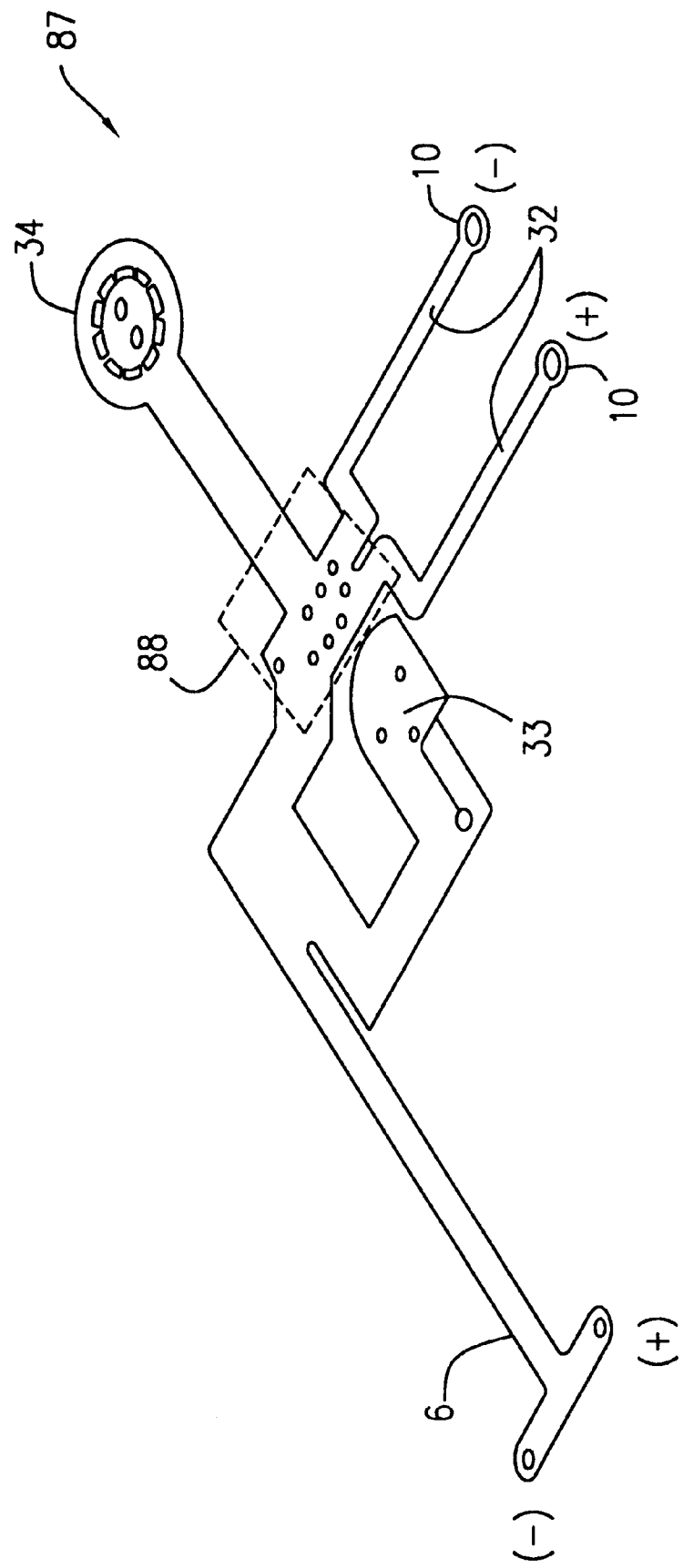
FIG. 15 shows a pictorial isometric view of the flexible printed circuit board according to the present invention.

FIG. 15 shows a pictorial isometric view of the flexible pcb 87, which forms all the interconnections which were not accomplished on the rigid pcb. This figure shows the flexible pcb as fabricated, prior to its being folded inside the monocular. The flexible pcb is soldered to the top of the rigid pcb 76 via eight pins, as represented by reference numeral 88. Alternatively, the flexible pcb could be permanently bonded to the rigid pcb, but the solder attachment method results in lower assembly costs. As previously described, t-shaped segment 6 provides the circuit connections to the battery, while flexible arms 32 include sockets 10 which mate to the external contacts rather than in the upper housing. Circuit connections 33 provide electrical communication between the user adjustable control knobs, variable gain element 99 (FIG. 15B), and the rigid pcb.

Figure 16:
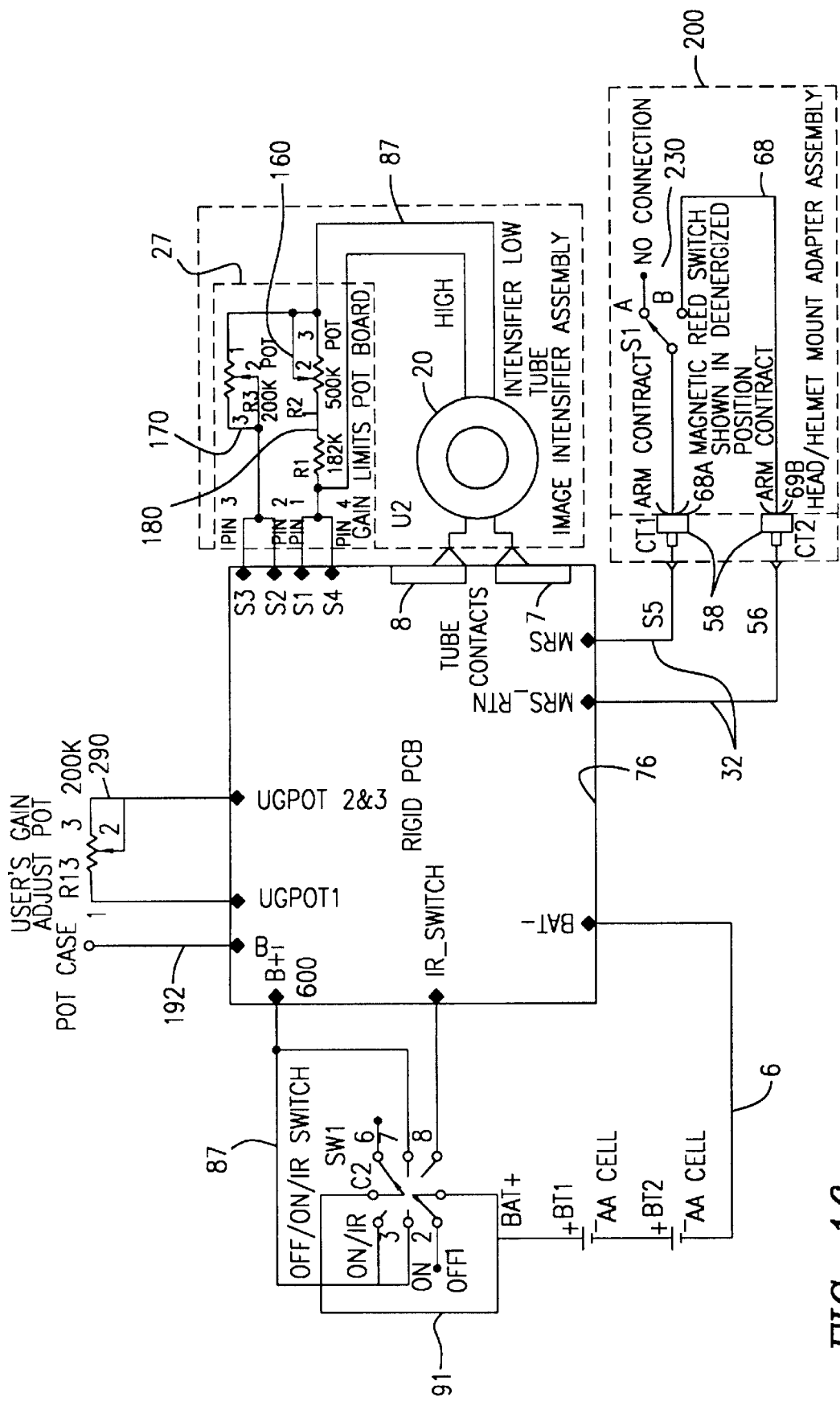
FIG. 16 is a schematic illustrating the electrical connections external to the rigid electronic printed circuit board, as established by the flexible printed circuits.
Figure 17:
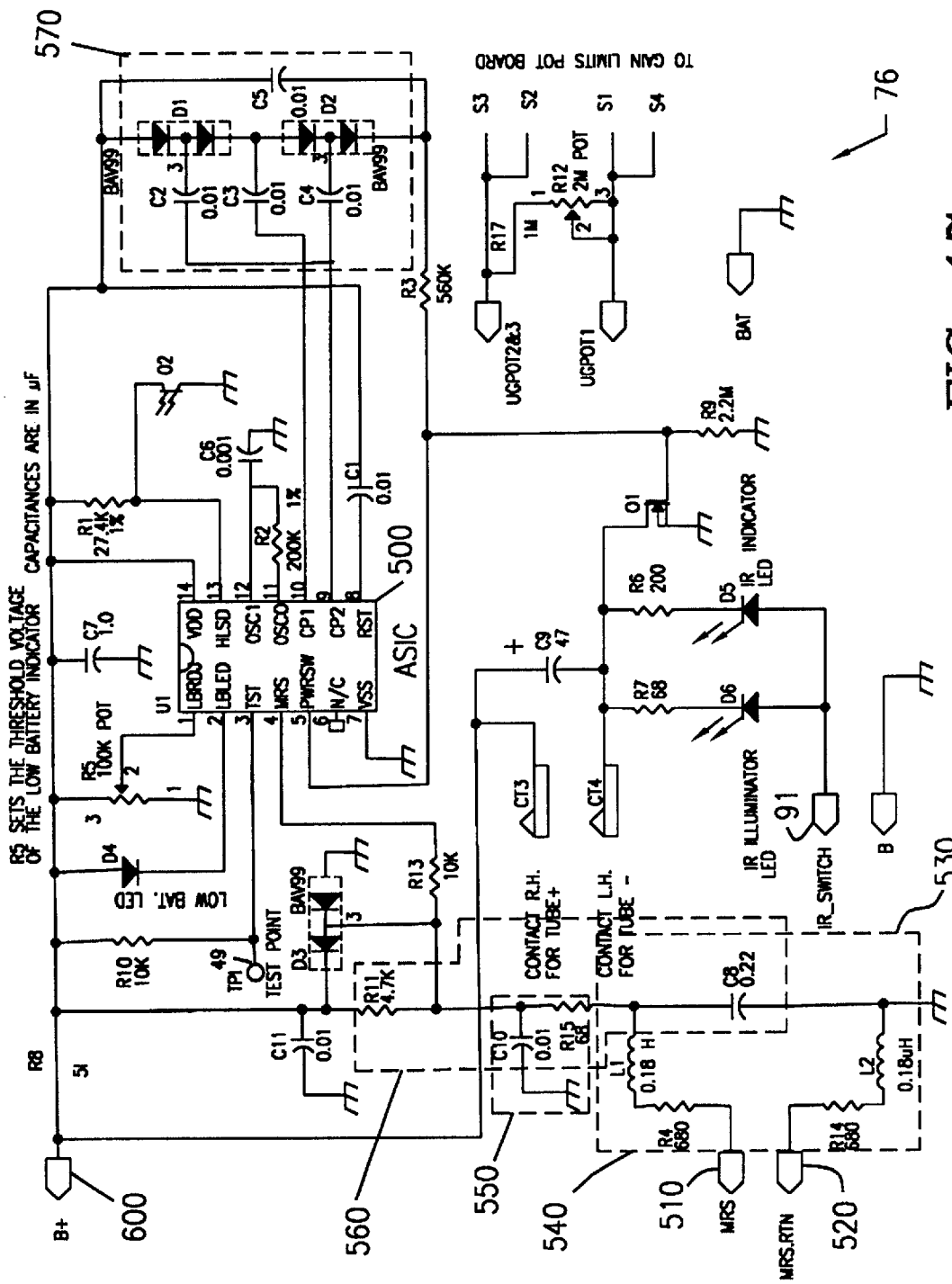
FIG. 17 is a schematic illustrating the electrical connections and components on the rigid electronic printed circuit board.

FIG. 16 schematically shows the overall circuit for the variable-gain night-vision monocular. Note that the values associated with the components identified in FIGS. 16 and 17 are exemplary, and that other values may be utilized in combination to achieve similar results. The electrical interconnections on the flexible pcb which connect the rigid pcb and batteries BT1 and BT2 with the other items comprise etched copper traces bonded to the flexible support material, which preferably is polyamide. Note that the variable gain image intensifier assembly is described in detail in patent application Ser. No. 09/123,371, and incorporated herein by reference. The image intensifier tube connects to the rigid pcb via the tube spring contacts 7 and 8 and via the sockets S1 through S4 through potentiometer board 27. The terminals high and low are electrically connected between the image intensifier tube 20 and potentiometer board 27 via the flexible circuit. As shown in FIG. 16, the potentiometer labeled 170 is used to factory set the minimum gain limit of the tube. The minimum gain limit is set by connecting a short circuit between the S3–S2 pin pair and the S1–S4 pin pair and then adjusting potentiometer 170 to establish the desired minimum gain. The short circuit represents the minimum resistance of the external circuit in the night vision device, and the user's gain adjustment control 290 is adjusted to a minimum.

The maximum gain limit is set by connecting a resistor of a defined fixed value between the S1–S4 pin pair and S2–S3 pin pair and adjusting the potentiometer 160 to establish the maximum gain. The fixed resistance represents the maximum resistance of the external circuit in the night vision system when the user's gain adjustment control is adjusted to maximum. The potentiometer board also contains the fixed resistor 180 which is connected in series with potentiometer 160 to establish the desired adjustment range, allowing full use of the available adjustment range of potentiometer 160 for ease of gain setting, while returning enough adjustment range to allow a number of combinations of power supplies and tube modules to be set up to the same gain limit. Preferably, the potentiometer 160 is a 500 KΩ potentiometer, potentiometer 170 is a 200 KΩ potentiometer and resistor 180 is 182 KΩ In this range, there is some interaction between the settings of potentiometers 160 and 170. Note that the four sockets S1–S4 which are used to receive the potentiometer board provide improved mechanical support and improve the electrical reliability, such that any one connection can be open without affecting the operation of the circuit. Note further that, as previously described, pin S4 is offset to prevent the board from being plugged backwards into the system. Thus, as one can ascertain, potentiometers 160 and 170 on the potentiometer board 27 set the maximum and minimum gain achievable by a user through adjustment of potentiometer 290 by using the external gain control knob 99 (see FIG. 1, 13). The user's gain adjustment control R13 is a potentiometer connected to the flexible pcb. The user's gain adjustment control also includes a tab 192 attached to the housing of the potentiometer 290, which is electrically connected to the shaft of the potentiometer. This tab is connected through the flexible pcb to battery negative B–, which is circuit "ground". This connection protects the variable gain tube assembly from potentially damaging electrostatic discharges (esd) by diverting esd currents to "ground" and away from the sensitive gain control components in the tube's integral power supply. The onl/offer switch 91 is a three-position switch like that used in the AN/PVS-7. The on/off/ir switch is connected to the battery and to the rigid pcb via connections on the flexible pcb 87.

The head/helmet mount adapter assembly 200, as shown schematically in FIG. 16, is detachable from the monocular. The head/helmet mount adapter assembly or mounting arm contains the magnetic reed switch 230 which senses the flipped up or detached state of the adapter with respect to the head mount or helmet mount. The head/helmet mount adapter assembly also contains an interconnecting cable 68 and two spring contacts 69A,B which mate to the respective fixed contacts CT1 and CT2 which are part of the upper housing of the monocular. Unlike the AN/PVS-7, only two of the magnetic reed switch connections are used in the monocular. When reed switch 230 is in the de-energized position (i.e. position A), no electrical contact is made between head/helmet mount assembly and the printed circuit board 76. When the reed switch senses the connectivity between the spring contacts mating to the fixed contacts CT1 and CT2 (reference numerals 58) on the upper housing, the reed switch activates to position B. The circuit is completed to the rigid pcb via sockets S5 and S6, and by the arms 32 of the flexible pcb 87 to contact points labeled as MRS and MRS_RTN for signaling to ASIC 500 (FIG. 17). This circuit is open unless the head/helmet mount adapter assembly is attached to the monocular and is installed in the flipped-down position in the head or helmet mount, in which case the magnetic reed switch is in proximity to the magnet in the head or helmet mount and the circuit is closed (position B). The monocular housing is made of a filled polymer which is partially conductive. The filler imparts good strength to the material, as well as conductivity. The fixed contact, CT1, is mounted in an insulating cup (not shown) installed in the housing wall, so that this contact is electrically isolated. The other fixed contact, CT2, is mounted directly in the housing wall, as this side of the circuit eventually returns to circuit ground and does not need to be isolated from the housing. Both contacts, CT1 and CT2, are recessed in the upper housing wall to provide additional mechanical protection and to prevent short circuiting when the monocular is mounted to the small arms adapter or when touching other conductive surfaces. The insulating cup associated with the contact CT1 comprises a thin material which permits esd to arc from CT1 to the partially conductive housing, thereby safely dissipating much of the esd energy before it can damage internal components.

FIG. 17 schematically shows the portion of the circuit contained on the rigid pcb 76. Connections to the flexible circuit 87 are labeled with names corresponding to the names shown on the rigid pcb schematic in FIG. 16. While much of the circuit is the same as that used and described in the AN/PVS-7 system, the differences include the circuit portions associated with the magnetic reed switch interface circuit and the variable gain interface circuit. Note that ASIC 500 is of a type used in prior art night vision devices, such as in the AN/PVS-7, and used as part of the circuit functionality, and that resistance values are in ohms while capacitance values are indicated in microfarads ($\mu$F).

The ASIC input, pin 4, (MRS) senses the state of the magnetic reed switch, as described above. This input is a CMOS input and is subject to damage from electrostatic discharge or esd. In addition, the magnetic reed switch 230 can "bounce" when it is changing state, causing spurious edges on the input signal, which would cause the image intensifier to turn off at times when this function is unintended. The components between MRS input to the circuit 510 and the MRS input to the ASIC (pin 4) form a protective/filtering network, which prevents damage from esd and prevents unintentional turn-off. The MRS and MRS_RTN inputs (510, 520) to the rigid pcb have series resistors, R4 and R14, respectively, which help absorb any esd energy and help isolate the exposed contacts and the external reed switch circuit from the circuits internal to the housing. R4 and R14 are surface-mount resistors which are physically larger [how large? What requirements?] than the size typically used in the remainder of the circuit in order to absorb the esd without incurring physical damage. Alternatively, other types of larger leaded resistors may also be used. However, the use of surface-mount resistors include the advantages of low cost and ease of installation along with the other surface-mount parts in a compatible process. Inductors L1 and L2 are connected in series with R4 and R14 respectively. These components, along with capacitor C8, connected between L1 and L2 and to local ground 530, form a filter network 540 to reduce the speed of the esd waveform and to further reduce peak voltage(s) of the esd waveform. Series resistor R15 and shunt capacitor C10 form an additional filter network 550. Resistor R11 connects to the positive supply voltage B+ (600) for the ASIC, and serves to pull the MRS input 4 of the ASIC to a logic "high" state when the head/helmet mount adapter assembly is disconnected, or when the head/helmet mount adapter assembly is removed or flipped up from the head mount or helmet mount, such that the magnetic reed switch is in the open state. The resistance value of resistor R11 is chosen so that the resistor does not consume excessive current when the magnetic reed switch is closed. When the head/helmet mount adapter assembly is installed on the monocular and the adapter is in the operating position in the head or helmet mount, the magnetic reed switch is in proximity to the magnet and is in the closed state. In this state, the MRS input of the ASIC is pulled to a logic "low" state by the action of the voltage drop across R11, produced by the current path through R15, L1, R4, the external magnetic reed switch in the mounting arm, R14 and L2, to local ground 530. Resistor R13 conducts the logic "high" or "low" signal to the MRS input 4 of the ASIC, and provides further protection from esd or other overcurrent to this input. The dual diode, D3, operates to clamp any voltage on the MRS input which would otherwise be more than one diode drop higher than the local power supply voltage or more than one diode drop lower than ground. In this manner, D3 affords additional protection to the MRS input of the ASIC. Resistor R11 and the combination of capacitor C10 with C8 form a filter 560 which removes any spurious edges associated with the bounce of the magnetic reed switch, before the edges can reach the MRS input of the ASIC. The capacitors, C11 and C7, connected from the positive supply voltage 600 of the ASIC to local ground 530, filter the supply voltage and help absorb additional esd transient energy.

Still referring to FIG. 17 in conjunction with FIG. 16, the gain limits potentiometer board 27, which is part of the variable gain tube assembly, interconnects with or "plugs into" the rigid pcb 76 at sockets S1 through S4. S1 and S4 are connected electrically in common, as are S2 and S3. These common connections provide redundant contacts for increased reliability of the connections from the variable gain intensifier tube 20 to the user's gain adjustment control 290. These connections proceed through the rigid pcb to the flexible pcb and finally to the user's gain control potentiometer. While a mechanical rotary potentiometer is illustrated in the present embodiment, alternative embodiments such as electrically-alterable potentiometers are also contemplated. On the rigid pcb 76, the series combination of the fixed resistor, R17, and the screwdriver-adjust trim potentiometer, R12, are connected in parallel with the user's gain control potentiometer. Following assembly of the circuit resistor, R17 is adjusted once to establish a fixed resistance from the S1/S4 pair to the S2/S3 pair when the user's gain control is set to maximum. The fixed resistance value chosen in this embodiment is 174 kΩ, but it is understood that other values could be selected for other systems. This adjustment of resistor R17 operates to correct for manufacturing variations in the maximum resistance of the user's gain control, so that all monoculars will produce the same maximum gain when tested with identical tubes. The user's gain adjustment control goes virtually to zero ohms when it is set to minimum. This assures that all monoculars will also produce the same minimum gain when tested with identical tubes. Since the tubes have all been adjusted to produce the same gain limits, all the tubes are interchangeable in all the monoculars of this type, producing the same maximum and minimum gain limits without the need for a maintainer to make any adjustments.

The remainder of the circuit schematic operates as follows. Positive battery power, B+, is supplied from the battery via the on/off/ir switch 91. The series resistor, R8, limits inrush current and protects the ASIC from overcurrent if the batteries are installed backwards. The positive battery power is fed to the ASIC via the power input (pin 14, VDD). Resistor R10 pulls the test input (pin 3, TST) of the ASIC up to the positive input voltage. This is the normal operating condition, and the test input enables the full divider chain in the ASIC to produce the full highlight shutdown delay time. As described above, if the test point TP1 is grounded, the ASIC reduces the shutdown delay time to hasten the test cycle.

Figure 6:
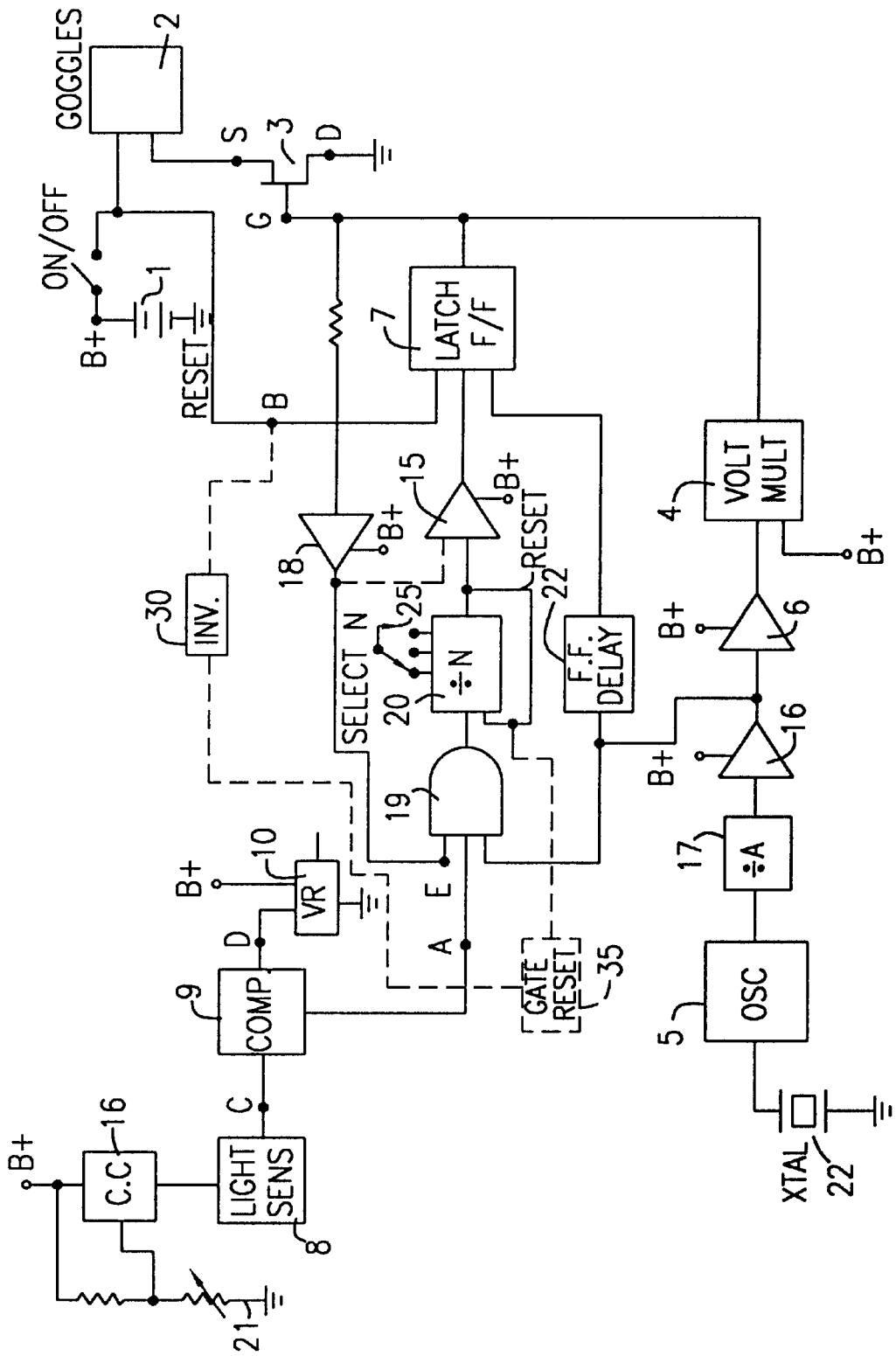
FIG. 6 is a block diagram of a prior art high light level cutoff apparatus having portions contained on an ASIC.

Resistor R5 is a screwdriver-adjust potentiometer, used to factory-set the low battery indicator threshold as described above. R5 can also be implemented as a series pair of trimmable resistors. The tap point of R5 connects to the low battery sensor input (pin 1, LBRDJ) of the ASIC. Q2 is the photo transistor which serves as the light sensor for highlight cutoff. Its collector is pulled up to the positive supply voltage by R1. Alternatively, Q2 can be a photo resistor. Upon exposure to light, Q2 conducts current to ground, creating a voltage drop across R1. When the voltage goes below the threshold of the high light shutdown input (pin 13, HLSD), the ASIC begins its time-delay sequence, culminating in shutdown of the intensifier tube if the high-light condition persists. Capacitor C6 and resistor R2, connected to the oscillator (pins 12, OSC1, and 11, OCSO) of the ASIC form the timing network which replaces the crystal in FIG. 6 (prior art) and controls the oscillator frequency. Two outputs of the ASIC, pins 10 (CP1), and 9, (CP2) switch between the positive supply voltage and ground at the oscillator frequency. These drive the multiplier network 570 consisting of C2, C3, C4, C5 and dual diodes, D1 and D2. The multiplier network steps up the positive supply voltage sufficiently to assure that the gate voltage of the power switching FET, Q1, will be adequate to establish a low resistance in the drain-source circuit of the FET, when on. The output voltage of the multiplier is fed to the gate of Q1 and to the power switch control output (pin 5, PWRSW) of the ASIC, via a series resistor, R3. Normally, pin 5 of the ASIC draws no current. Pin 5 draws current when the ASIC shuts down the intensifier. In this case, the voltage drop produced across R3 lowers the gate voltage of Q1 to a value below the threshold voltage of Q1, assuring that Q1 ceases to draw current, turning off the intensifier tube and also turning off the infrared illuminator and infrared indicator LED, if on. The infrared illuminator connects from the positive battery voltage, via the ir contacts of the off/on/ir switch, to R7, a series current-limiting resistor, which in turn connects to the drain of Q1. In like manner, the infrared indicator LED connects from the positive battery voltage, via the ir contacts of the off/on/ir switch, to R6, a series current-limiting resistor, which in turn connects to the drain of Q1. The drain of Q1 also connects to the negative voltage input of the image intensifier tube via the left-hand spring contact, CT4. Positive voltage to the tube is supplied via the right-hand spring contact, CT3. The capacitor, C9, filters the power to the intensifier tube and suppresses ripple produced by the intensifier tube's integral power supply.

This circuit according to the present invention is operable within the AN/PVS-14 military night vision monocular, and in similar commercial night vision systems. This circuit can also be applied in other night vision systems such as monoculars, binoculars, binoculars, and weapon sights, where features such as variable gain, flip-up cutoff, low battery indication, infrared illumination, and high-light cutoff are needed. This circuit could also be applied in other hand-held, head-mounted, or battery-operated systems.

It should be understood that a person skilled in the art may make many variations and modifications to embodiments utilizing functionally equivalent elements to those described herein. Any and all such variations or modifications, as well as others which may become apparent to those skilled in the art, are intended to be included within the scope of the invention as defined by the appended claims.

What is claimed is:

1. An electronic circuit for use in a monocular night vision device for electronically controlling a plurality of components within said device, said device having an objective lens assembly for receiving low intensity light, an image intensifier assembly comprising a variable gain image intensifier tube having a user-adjustable variable gain controller external to said tube for adjusting the light intensity level of a visible output image, a single eyepiece lens assembly for viewing said output image from said image intensifier assembly; and a non-metallic housing comprising an upper housing for receiving the objective lens assembly, image intensifier assembly, and eyepiece lens assembly, and a lower housing containing a battery cavity for receiving at least one battery to power said device, wherein said housing aligns said objective lens assembly with said image intensifier assembly and said eyepiece lens assembly along an optical axis, and wherein said upper and lower housing are coupled to one another along said optical axis, said electronic circuit comprising:

a rigid printed circuit board (pcb) located within said lower housing having a plurality of contacts for enabling electronic communication with a plurality of components mounted thereon and with said variable gain image intensifier tube, said rigid pcb including a pair of contacts in electrical communication with said image intensifier tube for energizing said intensifier tube; and a flexible printed circuit board flexibly coupled to said rigid pcb and adaptable to the geometry of the upper and lower housings for electronically interconnecting components located within said upper and lower housings with said rigid pcb, said flexible pcb having a first circuit connection to said image intensifier tube and a second circuit connection to an adjustable potentiometer mounted external to said image intensifier tube on said rigid pcb, said flexible pcb operative for coupling said adjustable gain potentiometer mounted external to said image intensifier tube to said rigid pcb via said first and second connections.

2. The electronic circuit according to claim 1, said flexible pcb further having a third circuit connection for coupling said user adjustable gain controller to said rigid pcb for communication with said adjustable gain potentiometer to control said variable gain.

3. The electronic circuit according to claim 1, wherein said flexible pcb further includes a circuit connection for coupling said at least one battery to said rigid pcb by means of a corresponding etched copper trace on said flexible pcb.

4. The electronic circuit according to claim 1, wherein said flexible pcb is flexibly coupled to said rigid pcb by means of soldered connections to said rigid pcb via eight pin contacts.

5. The electronic circuit according to claim 1, wherein said flexible pcb is flexibly coupled to said rigid pcb by means of a permanent bonding to said rigid pcb.

6. The electronic circuit according to claim 1, further comprising a rotary switch coupled to said rigid pcb via said flexible pcb for providing ON, OFF, and INFRA RED (IR) modes of operation.

7. The electronic circuit according to claim 1, wherein said components mounted on said rigid pcb include an illuminator diode and light sensor installed in a carrier attached to said rigid pcb for properly aligning said diode and sensor with windows in said upper housing.

8. The electronic circuit according to claim 1, wherein said adjustable gain potentiometer has a plurality of terminals for mounted onto said rigid pcb via a plurality of socket connections geometrically arranged to receive said plurality of terminals in such a way as to enable mounting in only one orientation.

9. The electronic circuit according to claim 1, wherein said monocular night vision device further includes a detachable peripheral adaptor assembly for coupling said monocular night vision device to an external unit, said peripheral adaptor assembly including a reed switch having a closed state wherein said reed switch electronically connects springable contacts and an open state wherein said springable contacts are electronically disconnected from one another, said peripheral assembly operable to attach to said upper housing by means of a mounting socket on said upper housing, said upper housing including a plurality of fixed contacts adjacent said mounting socket for electronically engaging a corresponding one of said springable contacts, wherein when said fixed contacts engage said springable contacts, said reed switch operates to sense said engagement and enter said closed state to connect said springable contacts to form a closed circuit.

10. The electronic circuit according to claim 9, wherein each of said fixed contacts is coupled to a respective contact on said rigid pcb by means of said flexible pcb for receiving signals from said peripheral assembly.

11. The electronic circuit according to claim 10, further comprising an ASIC mounted on said rigid pcb and having an input for receiving a signal from said peripheral assembly via one of said contacts on said rigid pcb indicative of the state of said reed switch.

12. The electronic circuit according to claim 11, further comprising filter means coupled between said contacts and said ASIC on said rigid pcb for absorbing electrostatic discharge when said reed switch changes state.

13. The electronic circuit according to claim 12, wherein said filter means comprises first resistor R4 coupled at a first terminal to one of said contacts and at a second terminal to a first inductor L1, a second resistor R14 coupled at a first terminal to another one of said contacts and at a second terminal to a second inductor L2, and a capacitor C8 having a first terminal coupled to said first inductor L1 and a second terminal coupled to said second inductor L2 and to ground potential for reducing peak voltages associated with said electrostatic discharge.

14. In a monocular night vision device having an objective lens assembly for receiving low intensity light, an image intensifier assembly comprising an image intensifier tube, a single eyepiece lens assembly for viewing an output image from said image intensifier assembly, and a non-metallic housing comprising an upper housing for receiving the objective lens assembly, image intensifier assembly, and eyepiece lens assembly, and a lower housing containing a battery cavity for receiving at least one battery to power said device, wherein said housing aligns said objective lens assembly with said image intensifier assembly and said eyepiece lens assembly along an optical axis, and wherein said upper and lower housing are coupled to one another along said optical axis, an electronic circuit for electronically controlling said monocular device comprising:

a rigid printed circuit board (pcb) located in said lower housing having a plurality of electronic components mounted thereon and including an ASIC;

a single flexible pcb connected to said rigid pcb at a plurality of predetermined contact points on said rigid pcb for coupling components located external to said rigid pcb with said rigid pcb; and interface means for electronically coupling a peripheral electronic assembly having a magnetic reed switch and a connecting circuit to said monocular night vision device.

15. The electronic device according to claim 14, wherein said connecting circuit comprises first and second springable contacts coupled to one another by means of said magnetic reed switch, said magnetic reed switch operable for switching between a closed state wherein said reed switch electronically connects said first and second springable contacts, and an open state wherein said first and second springable contacts are electronically disconnected from one another, and wherein said interface means comprises a mounting socket on said upper housing and first and second fixed contacts adjacent said mounting socket for electronically engaging a corresponding one of said springable contacts, wherein said magnetic reed switch is in said closed state when said first and second fixed contacts engage said corresponding springable contacts, thereby forming a closed circuit, and wherein said magnetic reed switch in said open state when said first or second fixed contact is not engaged with said corresponding springable contact, thereby forming an open circuit, said reed switch operable to sense said engagement/disengagement for changing between open and closed states.

16. The electronic circuit according to claim 15, wherein said first and second fixed contacts are electronically coupled to corresponding first and second input contacts on said rigid pcb by means of said flexible pcb.

17. The electronic circuit according to claim 16, wherein said rigid pcb further includes a first filter means coupled between said ASIC and said first and second input contact for absorbing electrostatic discharge when said magnetic reed switch changes between said open and closed state.

18. The electronic circuit according to claim 15, wherein said first and second fixed contacts are recessed within said upper housing.

19. The electronic circuit according to claim 18, wherein said first fixed contact is mounted in an insulating cup in a wall of said upper housing to electrically isolate said first fixed contact and wherein said second fixed contact is mounted directly in said housing wall.

20. The electronic circuit according to claim 17, said rigid pcb further including second filter means for removing spurious distortions to a signal input to said ASIC resulting from a change in state of said magnetic reed switch.

21. The electronic circuit according to claim 17, wherein said first filter circuit means comprises a first resistor R4 coupled at a first terminal to one of said input contacts and at a second terminal to a first inductor L1, and a second resistor R14 coupled at a first terminal to another one of said input contacts and at a second terminal to a second inductor L2, wherein a capacitor C8 has a first terminal coupled to said first inductor L1 and a second terminal coupled to said second inductor L2 and to ground for reducing peak voltages associated with said electrostatic discharge.

22. The electronic circuit according to claim 19, further comprising second filter circuit means for removing said spurious distortion associated with said magnetic reed switch state change before such distortions reach the input of said ASIC, wherein said second filter circuit means comprises resistor R11 in combination with the capacitor C10 and said capacitor C8.

23. The electronic circuit according to claim 17, said rigid pcb further comprising diode means for clamping a voltage on said ASIC input which would otherwise be more than one diode drop higher than a power supply voltage or more than one drop lower than the ground potential voltage.

24. The electronic circuit according to claim 23, wherein said pcb further includes capacitor network comprising a capacitor C11 and a second capacitor C7 in parallel arrangement and coupled to a positive supply voltage at a first terminal and to a ground potential at a second terminal for filtering said supply voltage on said ASIC for absorbing est transient energy.

25. The electronic circuit according to claim 14, wherein said image intensifier assembly comprises a variable gain image intensifier tube having a user adjustable variable gain controller external to said tube for adjusting light intensity level of said visible output image, and wherein said flexible pcb has a first circuit connection to said image intensifier tube and a second circuit connection to an adjustable potentiometer mounted on said rigid pcb, said flexible pcb operative for coupling said adjustable gain potentiometer to said rigid pcb via said first and second connections.

26. The electronic circuit according to claim 25, wherein said rigid pcb includes first and second tube contacts in electrical communication with said image intensifier tube for energizing said intensifier tube.

27. The electronic circuit according to claim 26, said flexible pcb further having a third circuit connection for coupling said user adjustable gain controller to said rigid pcb for communication with said adjustable gain potentiometer for controlling said variable gain.

* * * * *